(12) United States Patent
Kasai

(10) Patent No.: US 6,545,614 B1
(45) Date of Patent: Apr. 8, 2003

(54) TOUCH SENSOR IDENTIFYING A BODY PART

(75) Inventor: Eiji Kasai, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 09/406,960

(22) Filed: Sep. 28, 1999

(30) Foreign Application Priority Data

Sep. 28, 1996 (JP) ............................................ 10-272728

(51) Int. Cl.$^7$ ............................................ H03K 17/995
(52) U.S. Cl. ............................................ 341/33; 341/34
(58) Field of Search ......................... 178/18.06, 19.03, 178/18.05; 341/33, 34; 345/173, 174, 157; 200/600; 128/903; 700/83; 600/476

(56) References Cited

U.S. PATENT DOCUMENTS

| | | | | |
|---|---|---|---|---|
| 4,103,252 A | * | 7/1978 | Bobick | 200/52 R |
| 4,237,421 A | * | 12/1980 | Waldron | 307/116 |
| 4,394,643 A | * | 7/1983 | Williams | 341/33 |
| 5,270,711 A | * | 12/1993 | Knapp | 178/18.01 |
| 5,386,219 A | * | 1/1995 | Greanias et al. | 345/174 |
| 5,463,388 A | * | 10/1995 | Boie et al. | 341/33 |
| 5,465,091 A | * | 11/1995 | Nishino et al. | 200/600 |
| 5,543,588 A | * | 8/1996 | Bisset et al. | 178/18.06 |
| 5,650,597 A | * | 7/1997 | Redmayne | 178/18.06 |
| 5,760,688 A | | 6/1998 | Kasai | 340/561 |
| 5,796,389 A | * | 8/1998 | Bertram et al. | 345/173 |
| 5,886,687 A | * | 3/1999 | Gibson | 178/18.06 |
| 5,990,804 A | | 11/1999 | Koyama | 340/5.82 |
| 6,107,924 A | | 8/2000 | Kasai et al. | 340/627 |
| 6,297,811 B1 | * | 10/2001 | Kent et al. | 178/18.01 |

FOREIGN PATENT DOCUMENTS

| | | |
|---|---|---|
| JP | 9-43007 | 2/1997 |
| JP | 10-165382 | 6/1998 |

* cited by examiner

*Primary Examiner*—Michael Horabik
*Assistant Examiner*—Hung Q Dang
(74) *Attorney, Agent, or Firm*—Morrison & Foerster, LLP

(57) ABSTRACT

A touch sensor which is able to detect the touch of a finger with reasonable accuracy. In this touch sensor, the oscillator unit supplies a high-frequency signal to the electrode unit. If the item detected is a biological entity of a human body such as a finger, the impedance of the electrode unit will change. The impedance is initially matched to that on the input side of the electrode when the finger is in touch with the electrodes. The reflected wave will be smaller because of the matching of impedance when the finger is in touch with the electrode. By detecting this reflected wave and comparing it with a reference signal in the discriminator unit, it can be determined that the reflection level is lower and so a conclusion can be made that the electrode is touched by a person.

37 Claims, 29 Drawing Sheets

ELECTRODE UNIT

LPF

HPF

BPF

TOUCH SENSOR IDENTIFYING A BODY PART

FIELD OF THE INVENTION

This invention relates to a touch sensor to detect the touch of a body part and in particular, to a touch sensor to detect the touch of a human finger for use in various electronic applications and security devices.

BACKGROUND OF THE INVENTION

Current touch detecting systems employ a variety of sensors, including optical, capacitance, electrical conductivity and pressure sensors. For example, a common capacitance sensor is described in Japanese Patent Publication (Kokai) 10-165382. The inventors previously developed a human body sensor which detects the presence of a person using high-frequency radiation (Patent publication (Kokai) 9-46205). In this device, illustrated in FIG. 1, a high-frequency signal is emitted by an oscillator 101. This signal is transmitted to a sensing unit 102. The presence of a human body changes the impedance of the circuit and causes the amplitude of the wave reflected by sensing unit 102 to vary along with it. The amplitude of this reflected wave is detected by a detector unit 103, and a control unit 104 determines from this level whether a person is present. In particular, FIG. 18 illustrates an exemplary circuit for the detector unit used in the configuration shown in FIG. 1.

Conventional touch sensors, however, do not have a capacity to determine whether the object touching the sensor is actually a finger. While some of the conventional inductance, electrical conductivity and high-frequency radiation sensors are not supposed to react unless they are touched by a finger, it is relatively easy to operate the sensors by intentionally touching them with an object having characteristics similar to a finger. That is, the conventional sensors are unable to properly discriminate. Detecting coils, for example, detect the presence of a human body before they are actually being touched, so they have a problem of accuracy in that they cannot determine whether the sensor was in fact touched by the human body.

SUMMARY OF THE INVENTION

The invention provides a touch sensor which is able to detect the touch of a finger with reasonable accuracy.

In one embodiment of the invention, a touch sensor includes an oscillator unit which outputs a high-frequency signal; an electrode unit which receives the high-frequency signal from the oscillator unit and which includes electrodes that are touched by the finger to be detected; a detector unit which outputs a signal which varies with the impedance of the electrode unit; a discriminator unit which determines whether the item detected is alive; and a reference unit in which a reference signal is stored prior to use to determine whether the item detected is a human body part.

In this touch sensor, the oscillator unit supplies a high-frequency signal to the electrode unit. If the item detected is a biological entity of a human body such as a finger, then the impedance of the electrode unit will change. The impedance is initially composed to the impedance on the input side of the electrode when the finger is touching the electrodes. The reflected wave will be smaller due to the change in impedance when the finger is touching the electrodes. By detecting this reflected wave and comparing it with a reference signal in the discriminator unit, it can be determined that the reflection level is lower and that the electrodes are being touched by a person.

In another embodiment of the Invention, a method of sensing a touch of a body part includes . . .

DETAILED DESCRIPTION OF THE INVENTION

Figure 1:
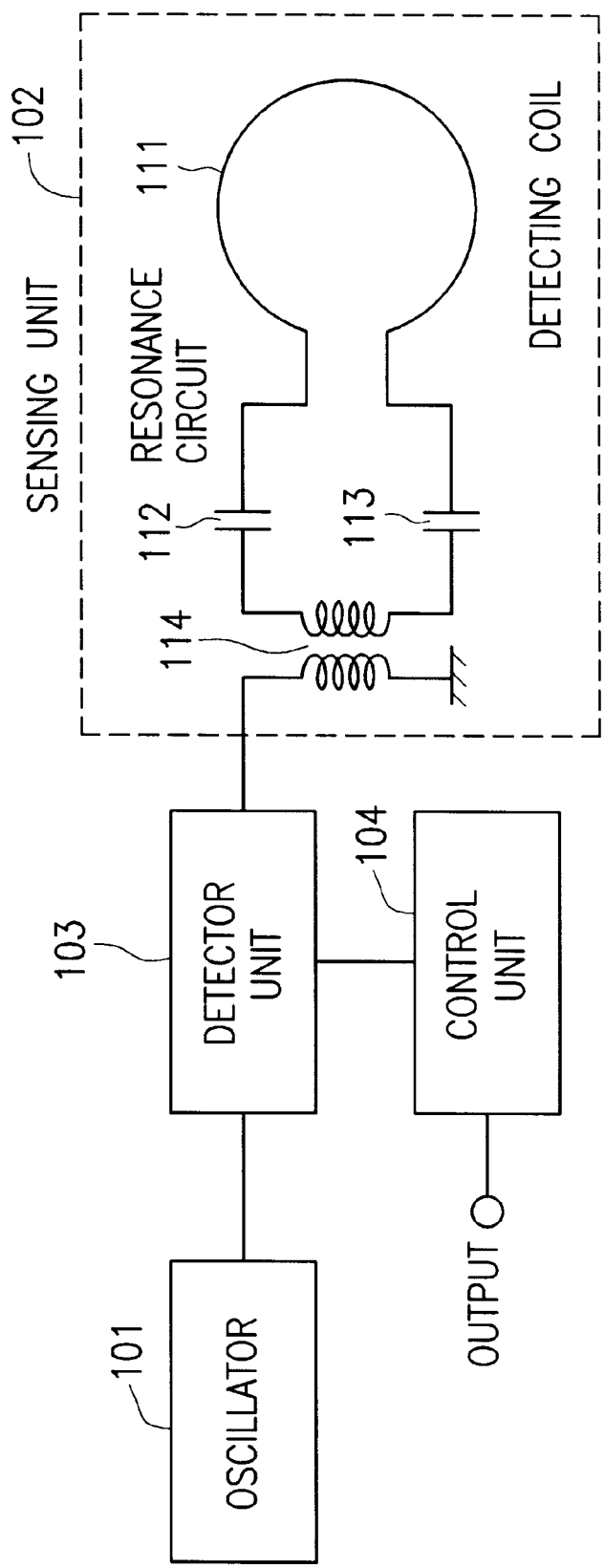
FIG. 1 is a block diagram of a touch sensor according to a prior art.
Figure 2:
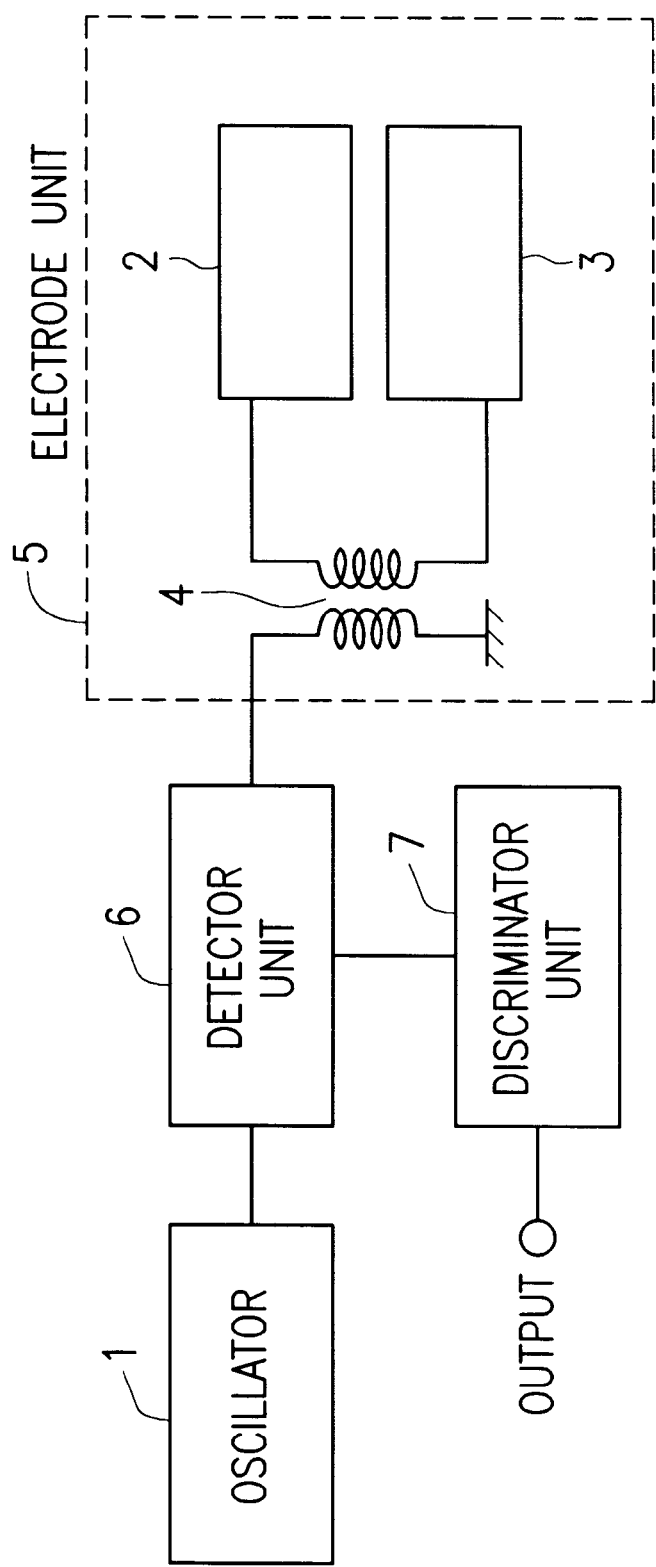
FIG. 2 is an exemplary block diagram of a touch sensor according to one embodiment the invention.

The invention will now be explained in greater detail with reference to several preferred embodiments. FIG. 2 is an exemplary block diagram of a touch sensor according to the first preferred embodiment of this invention. The touch sensor of this embodiment is designed to detect whether it has been touched by a finger. The touch sensor comprises an oscillator unit 1 which generates and emits a high-frequency signal, an electrode unit 5 which includes a pair of electrodes 2 and 3 and a transformer 4 which is used for an impedance comparison, a detector unit 6 which detects the level of the high-frequency signal supplied by oscillator unit 1 to electrode unit 5 and reflected by it, and a discriminator unit 7 which determines from the amplitude of the detected signal whether the touch sensor is touched by a finger.

Figure 3:
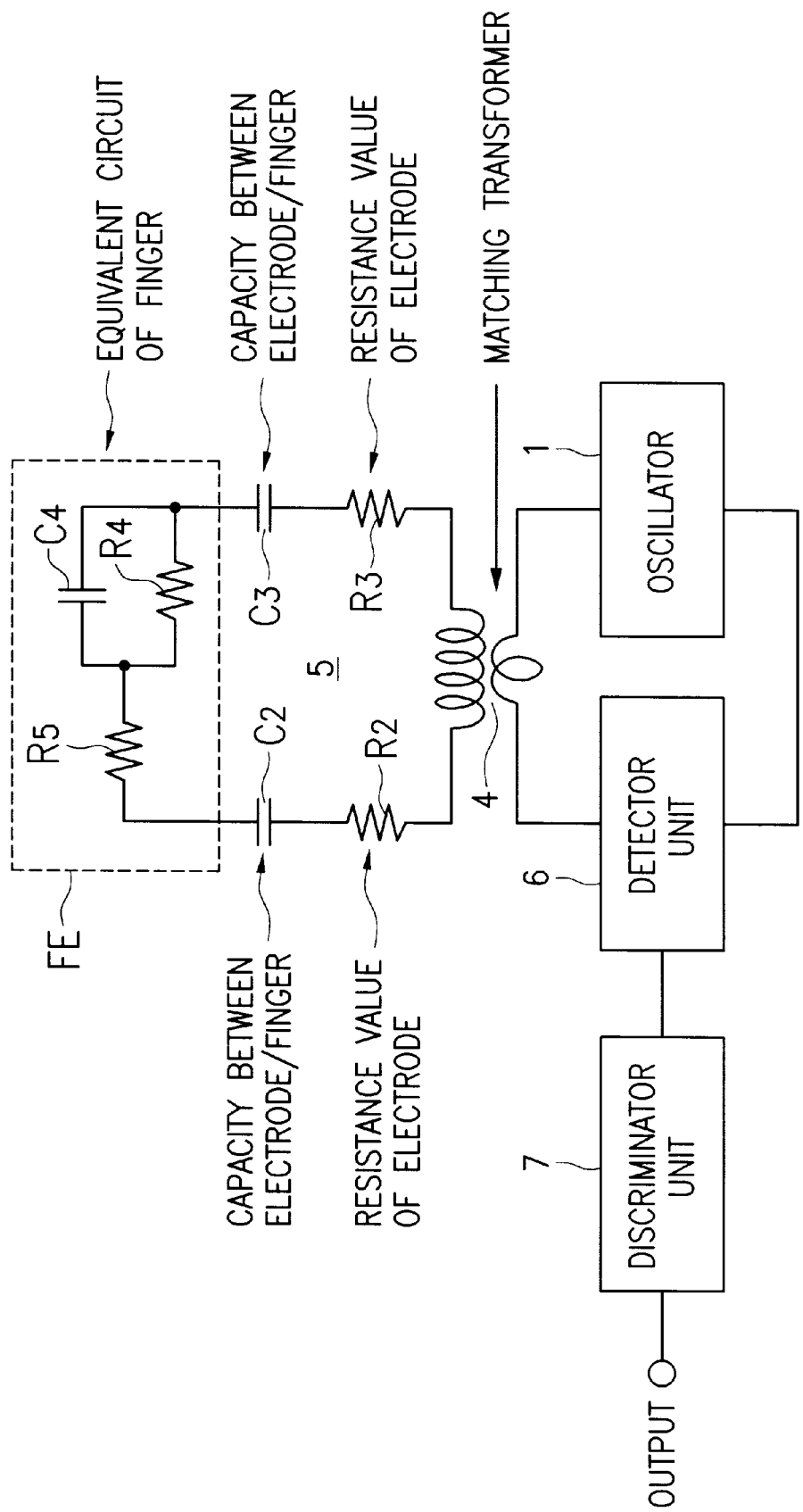
FIG. 3 is an exemplary diagram of an equivalent circuit which illustrates the principle of detection used in the touch sensor in FIG. 2.

FIG. 3 is an exemplary diagram of an equivalent circuit which illustrates the principle of detection used in the touch sensor in FIG. 2. When a finger is not touching the area between electrodes 2 and 3, respectively, the secondary side of transformer 4 is in an open state. When the area between electrodes 2 and 3 is touched, the resistance values $R_2$ and $R_3$ of electrodes 2 and 3, the capacitance values $C_2$ and $C_3$ between electrodes 2 and 3 and the finger, and the equivalent circuit FE of the finger, which includes a capacitor $C_4$ and resistors $R_4$ and $R_5$, are serially connected to the secondary coil of transformer 4. When a finger touches the area between electrodes 2 and 3, the capacitance between the finger and electrodes 2 and 3 increases and the high-frequency impedance value of the finger is compared to the reference value. Hence, the discriminator determines that the touch is that of a finger. The impedance measured on the secondary side of transformer 4, when a finger touches the electrodes, can be used as a criterion for comparison. The level of the high-frequency signal from oscillator unit 1, after it is reflected by electrode unit 5 determines whether the sensor has been touched by a finger. As an example, if the resistance value $R_4+R_5$ of the finger is approximately 40Ω, the resistance value $R_2+R_3$ is approximately 30Ω, the capacitance when the finger is touching the electrodes is approximately 3000 PF, and the reactive component ½ nfc of capacitance C is 1.3Ω (40.68 MHz), then the total impedance is 102.6Ω. If the transformer 4 is set at approximately 50:100, then its impedance will be approximately 50Ω when a finger is touching the sensor, and the values will be compared. If the compared values are set so that a match is defined as a finger touching the sensor, the comparison will not match when the sensor is touched by an object other than a finger, since it will have a different impedance value. If the item detected does not come in contact with the electrodes, then the capacitance will drop, and the reactive component of C will increase, and as a result, the values will not match. When the capacitance drops at this time, the imaginary component of the impedance will increase. Thus, even if the resistance components match, the imaginary quantities would not, and the touch sensor would not recognize the object as a finger.

Figure 4:
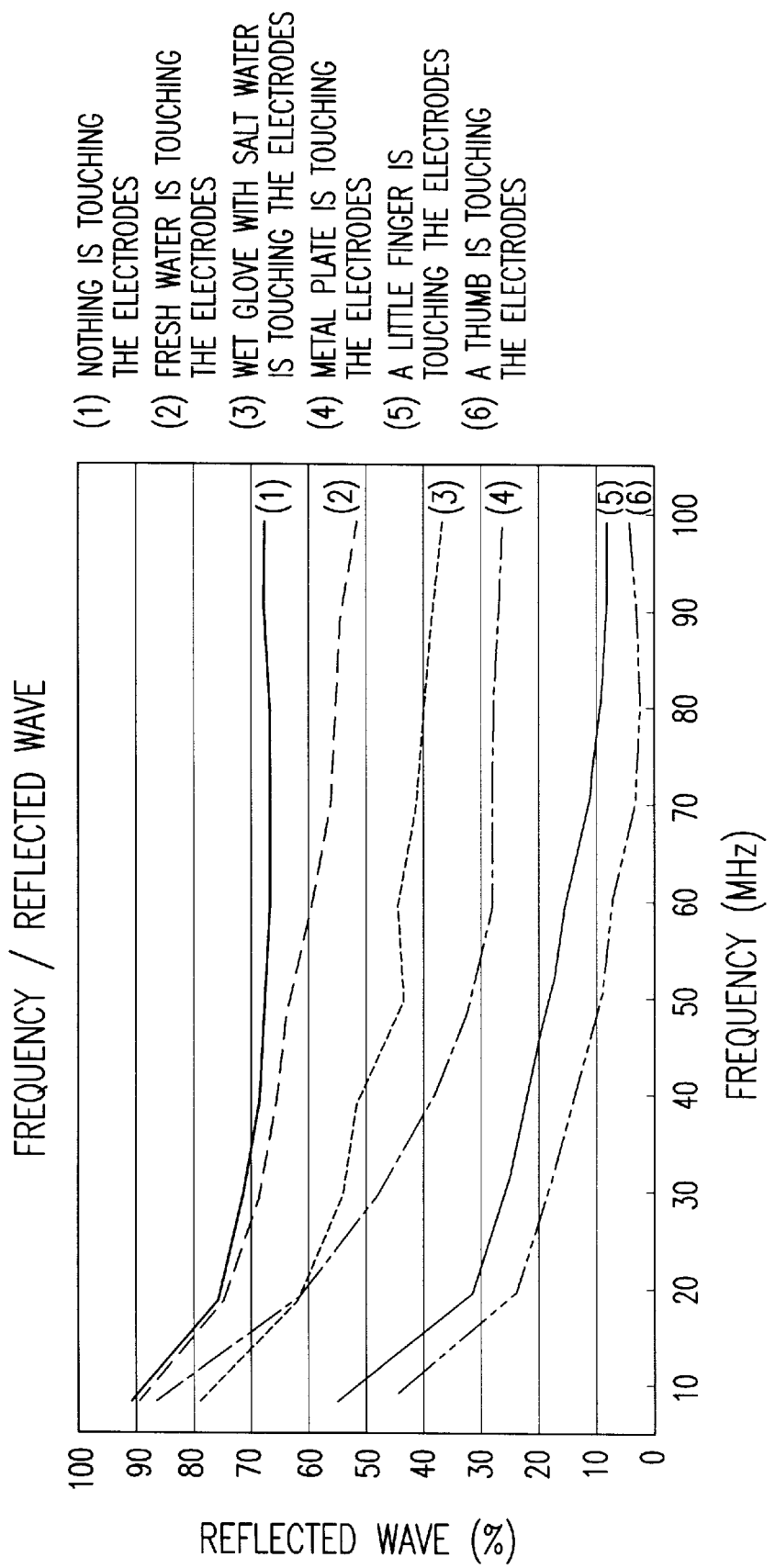
FIG. 4 is an exemplary graph of the relationship between the frequency and the reflected wave amplitude.

FIG. 4 is a graph of the relationship between the frequency and the reflected wave amplitude. The values are set so that a comparison of the impedance values match when a finger is touching the electrodes. Since the level of the reflected wave is set quite low when the thumb or little finger touches the detector, the threshold value of discriminator unit 7 should be set somewhat higher than the detected level for the little finger. This will ensure that discriminator unit 7 can detect the touch of a finger.

This embodiment of the touch sensor has two conditions: (1) the item makes contact with the electrodes just as a finger does, and (2) it has the same impedance component as a finger. This requirement keeps false positives to a minimum. The sensor is virtually immune to electromagnetic fields. The sensor employs ISM frequency, so it is not subject to laws governing radio or is it affected by radio interference. It can run on 1 mW of electricity, so it has no adverse effects on human beings. Other benefits may also be realized.

Figure 5A:
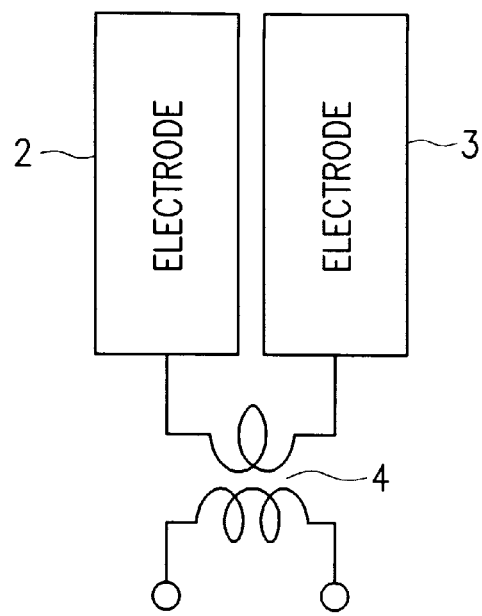
FIG. 5 illustrates an exemplary shape of the electrodes used in the touch sensor.
Figure 5B:
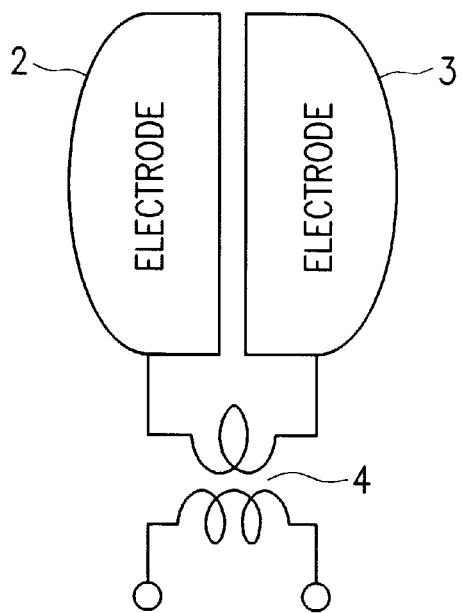
Figure 6A:
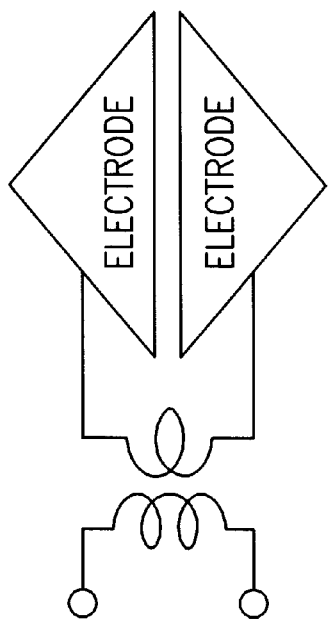
FIG. 6 illustrates another exemplary shape of the electrodes used in the touch sensor.
Figure 6B:
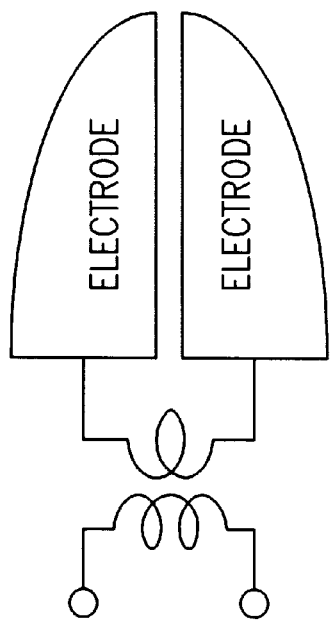

The electrodes 2 and 3, which enable the touch sensor to detect a finger in the embodiment discussed above, are symmetrically opposed to the left and right with a gap of 1 mm in between. They may be of various shapes, such as rectangular, as shown in FIG. 5(a), semicylindrical, as shown in FIG. 5(b), triangular, as shown in FIG. 6(a), or sword-shaped, as shown in FIG. 6(b).

Figure 7:
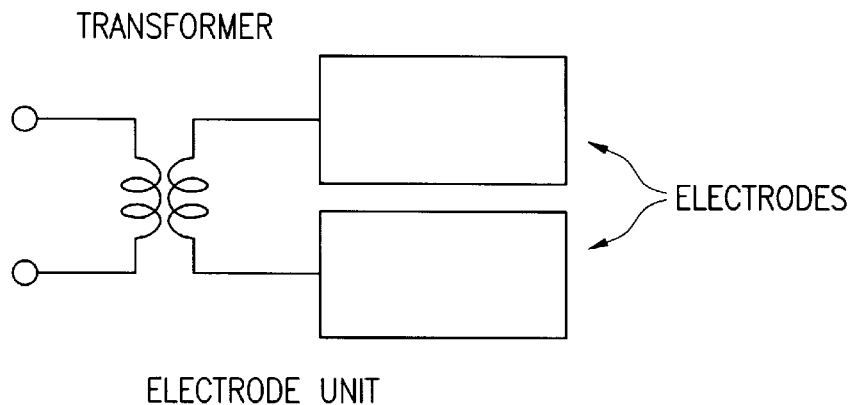
FIG. 7 illustrates an exemplary circuit for the electrodes.
Figure 8:
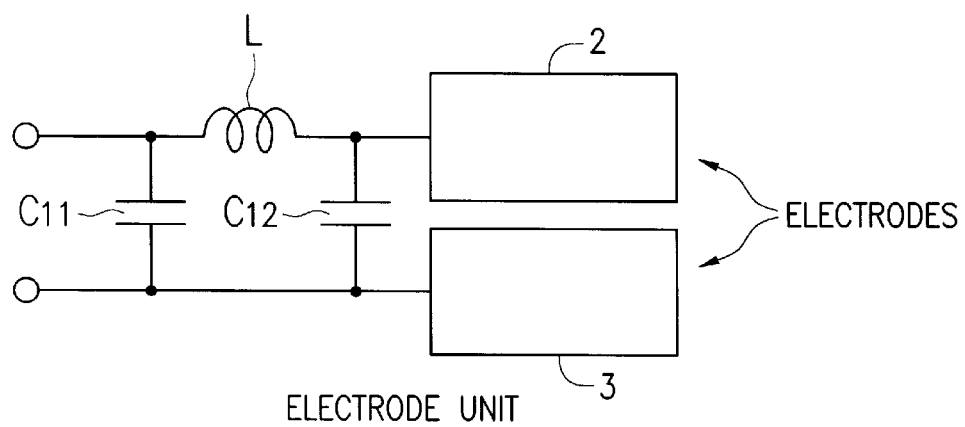
FIG. 8 illustrates another exemplary circuit for the electrodes.

As illustrated in FIG. 7, transformer 4 is used to match the impedance between electrodes 2 and 3 and the supply side of oscillator unit 1. Alternatively, as is shown in FIG. 8, a π-type impedance converter circuit comprising capacitors $C_{11}$ and $C_{12}$ and coil L may be used. Although they are not shown in the drawings, a T-type or L-type impedance converter circuit, for example, may also be used for impedance matching.

Figure 9:
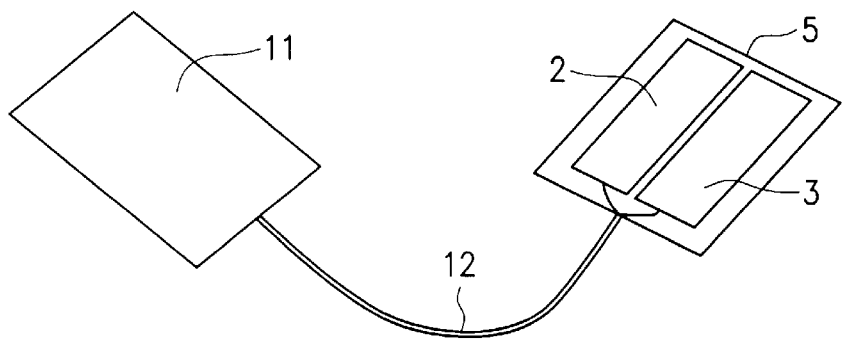
FIG. 9 illustrates another exemplary configuration of this invention.
Figure 10:
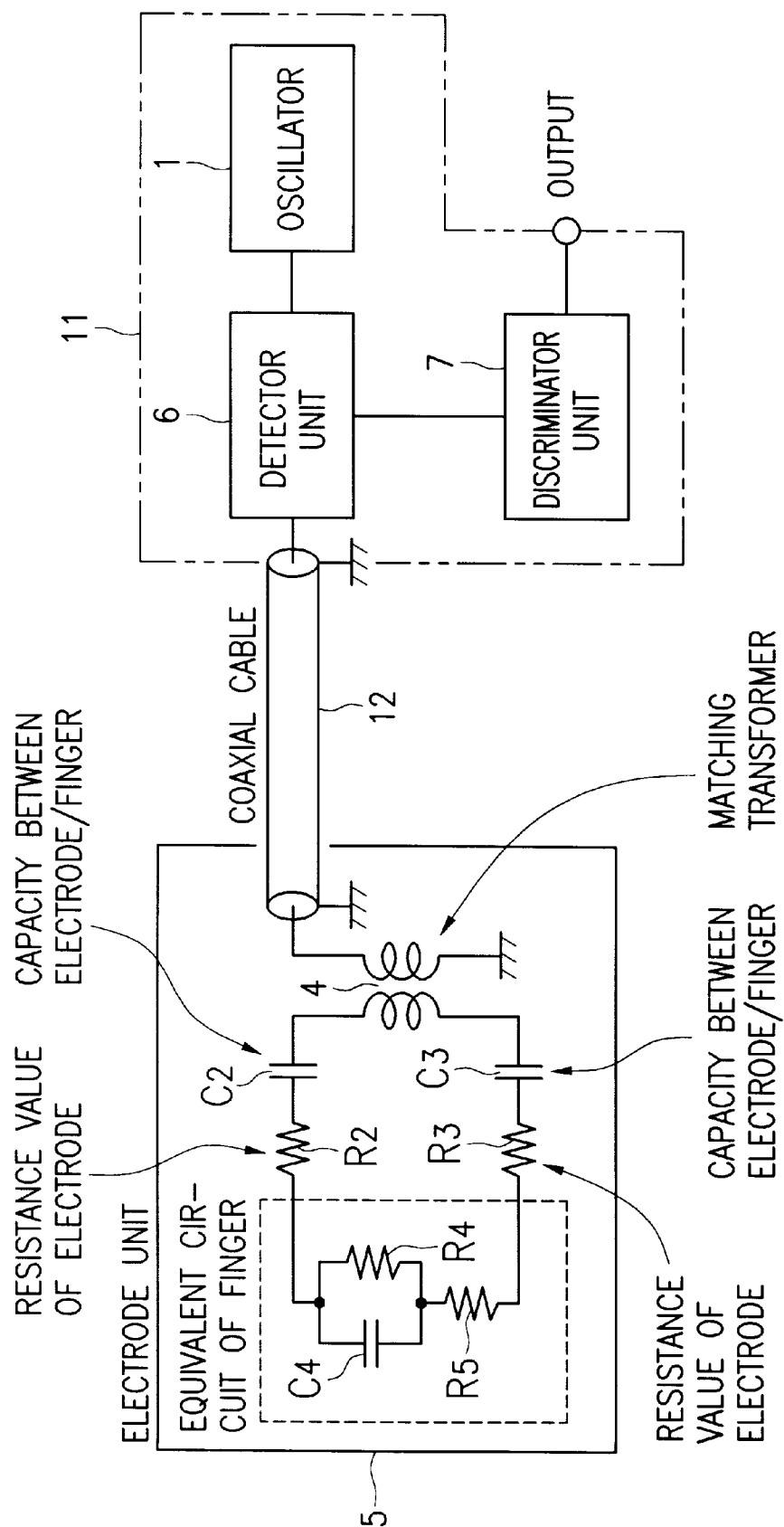
FIG. 10 illustrates an exemplary block diagram of the configuration shown in FIG. 9.

In the embodiment of the touch sensor discussed above, electrode unit 5, as well as the circuitry for oscillator unit 1, detector unit 6 and discriminator unit 7 are all housed in a single case. In another embodiment, shown in FIG. 9, electrode unit 5 and a circuit unit 11 are separate entities which are connected by a cable 12, forming a detached-type touch sensor. In this case, circuit unit 11 would contain oscillator unit 1, detector unit 6 and discriminator unit 7. This arrangement can prove helpful when the space for the touch sensor is limited. The circuit layout for this embodiment of the touch sensor is shown in FIG. 10. A coaxial cable is used for cable 12, and transformer 4 is housed in electrode unit 5.

Figure 11:
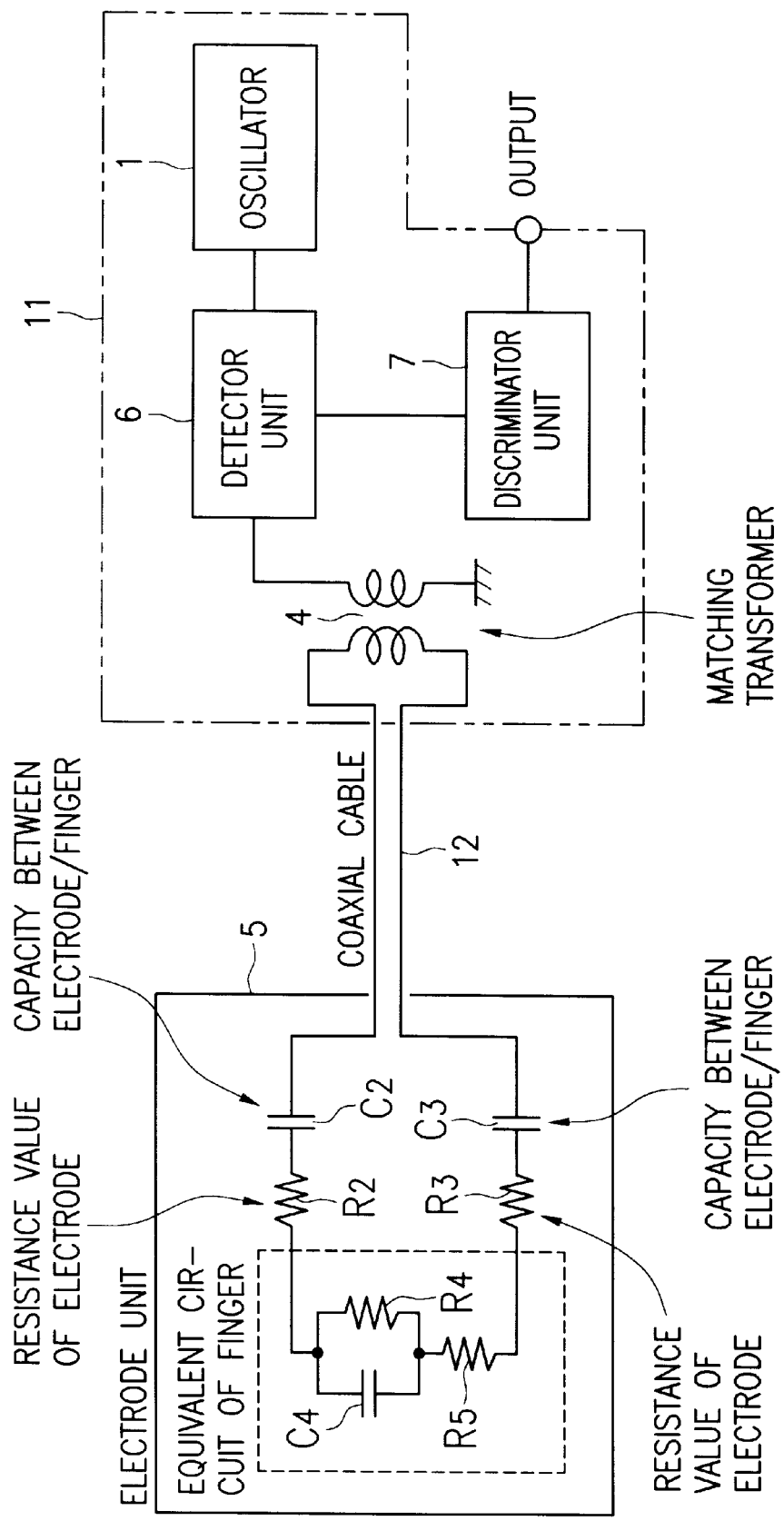
FIG. 11 illustrates another exemplary block diagram of the configuration shown in FIG. 9.

FIG. 11 is an exemplary block diagram of another circuit layout for a detached-type touch sensor. In this touch sensor, a balanced line is used as cable 12, and the design differs from that shown in FIG. 10 in that transformer 4 is placed in circuit unit 11.

Figure 12A:
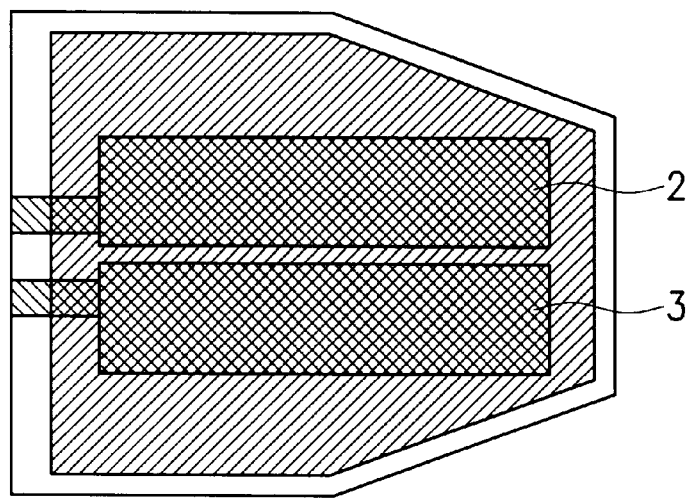
FIG. 12 illustrates an exemplary configuration of the electrodes used in the above embodiments.
Figure 12B:
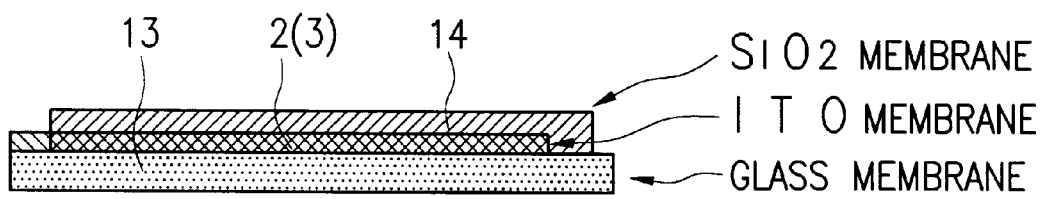

FIG. 12 exemplary the electrodes in the above-described embodiment of a touch sensor, without transformer 4. In this figure, (a) is a plan view and (b) is a cross sectional view. In FIG. 12, electrodes 2 and 3, which are made of ITO film, are formed on a glass substrate 13. They are then covered by a protective layer of $SiO_2$ film 14. For its protective qualities, a thicker layer of $SiO_2$ film 14 would seem desirable, however, a thinner layer is called for, as a thicker film would cause the capacitance C component to be unattainable. In fact, the thickness that is chosen for the $SiO_2$ film 14 is 1500 Å.

Figure 13:
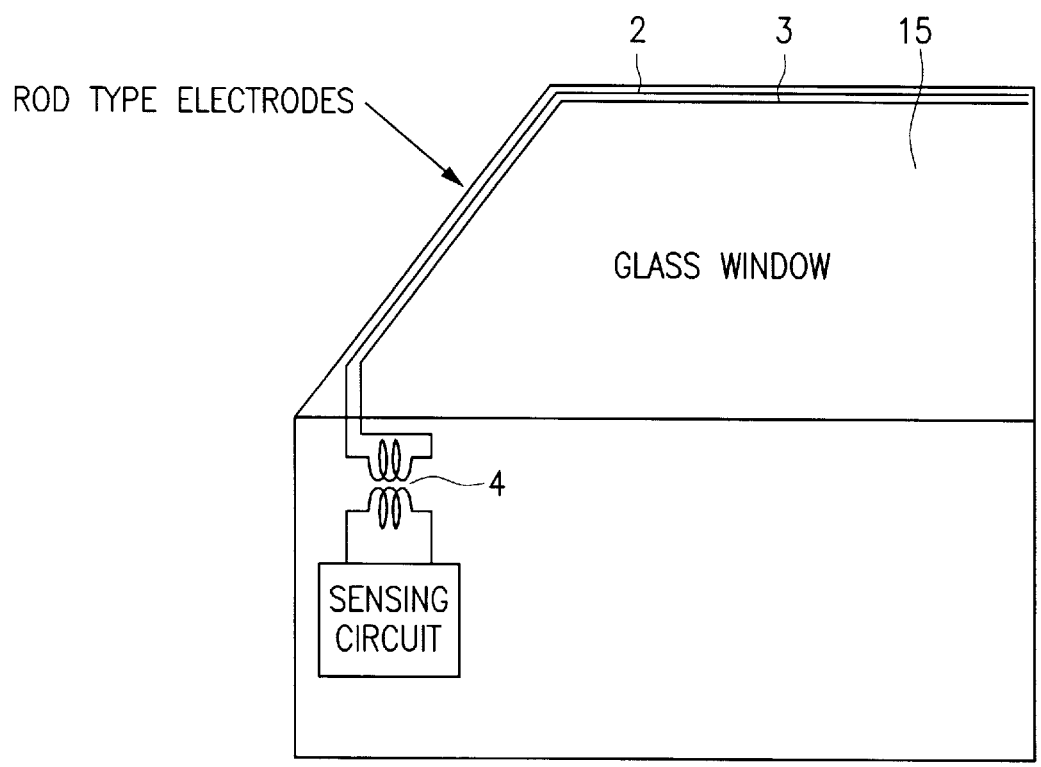
FIG. 13 illustrates another exemplary configuration of this invention.

The electrodes 2 and 3 shown in FIGS. 5, 6 and 12 have a large, flat area. In FIG. 13, the electrodes 2 and 3 take the form of long rods. These sort of electrodes could be placed along the top of a car window glass 15, where they could serve as sensors to prevent a passenger's fingers from being caught when the power window of an automobile closes. In this case, the electrodes would extend all along the top edge of window glass 15.

The capacitance between electrodes 2 and 3 in the above-described embodiment of a touch sensor depends upon the thickness of the $SiO_2$ film 14, shown in FIG. 12. However, the capacitance will rise only to the level of 500 PF when a (solid) non-biological substance comes in contact with electrodes 2 and 3. When a human being comes in contact with the electrodes, on the other hand, the capacitance will rise to 3000 PF. Thus, the threshold was chosen as 500 PF, and the system was designed so that the capacitance becomes more than 500 PF when a living being comes in contact with the electrodes.

Since this embodiment of a touch sensor can be used both as a touch sensor, when combined with a light, and in a fingerprint recognition system, the electrodes must allow light to pass through. The transmissivity of electrodes 2 and 3 is therefore specified to be greater than 50%. For this purpose, an ITO membrane can be used for electrodes 2 and 3.

If it is not necessary for light to pass through electrodes 2 and 3, they should be made of a material which is a good conductor of high-frequency radiation. This is important if the electrodes are long. Materials which are good high-frequency conductors include, for example, silver, gold, copper and aluminum. If electrodes 2 and 3 need not be translucent and they are to be relatively short, then detection can be accomplished by the use of semiconductors.

Figure 14:
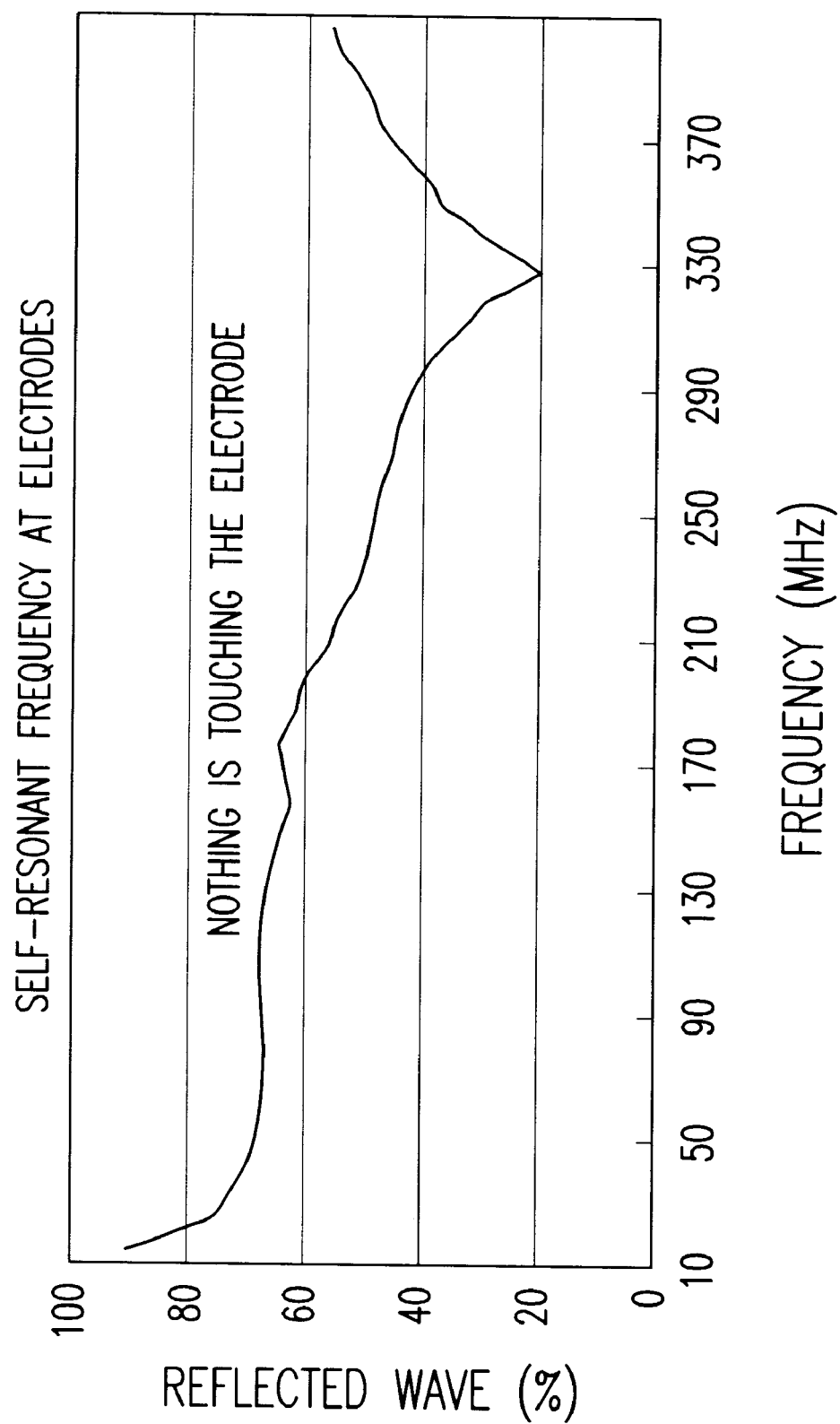
FIG. 14 illustrates an exemplary graph of the relationship between the frequency and the reflected wave amplitude.

When the level of the reflected wave obtained by electrode unit 5 is measured at various frequencies, as illustrated in FIG. 14, some of the levels become low, as well as self-resonant. The resulting frequencies depend on the types of electrodes. Even if the electrodes are relatively small, they will experience self-resonance at around 300 MHz. It is therefore desirable to use a frequency lower than 300 MHz.

Although this embodiment of a touch sensor can use any frequency over a wide band without resonance, substances vary in their frequency characteristics as shown in FIG. 4. If a frequency switching device to switch frequencies is added to the touch sensor so that a variety of frequencies can be used, then the selectivity of the sensor will be improved.

Figure 15:
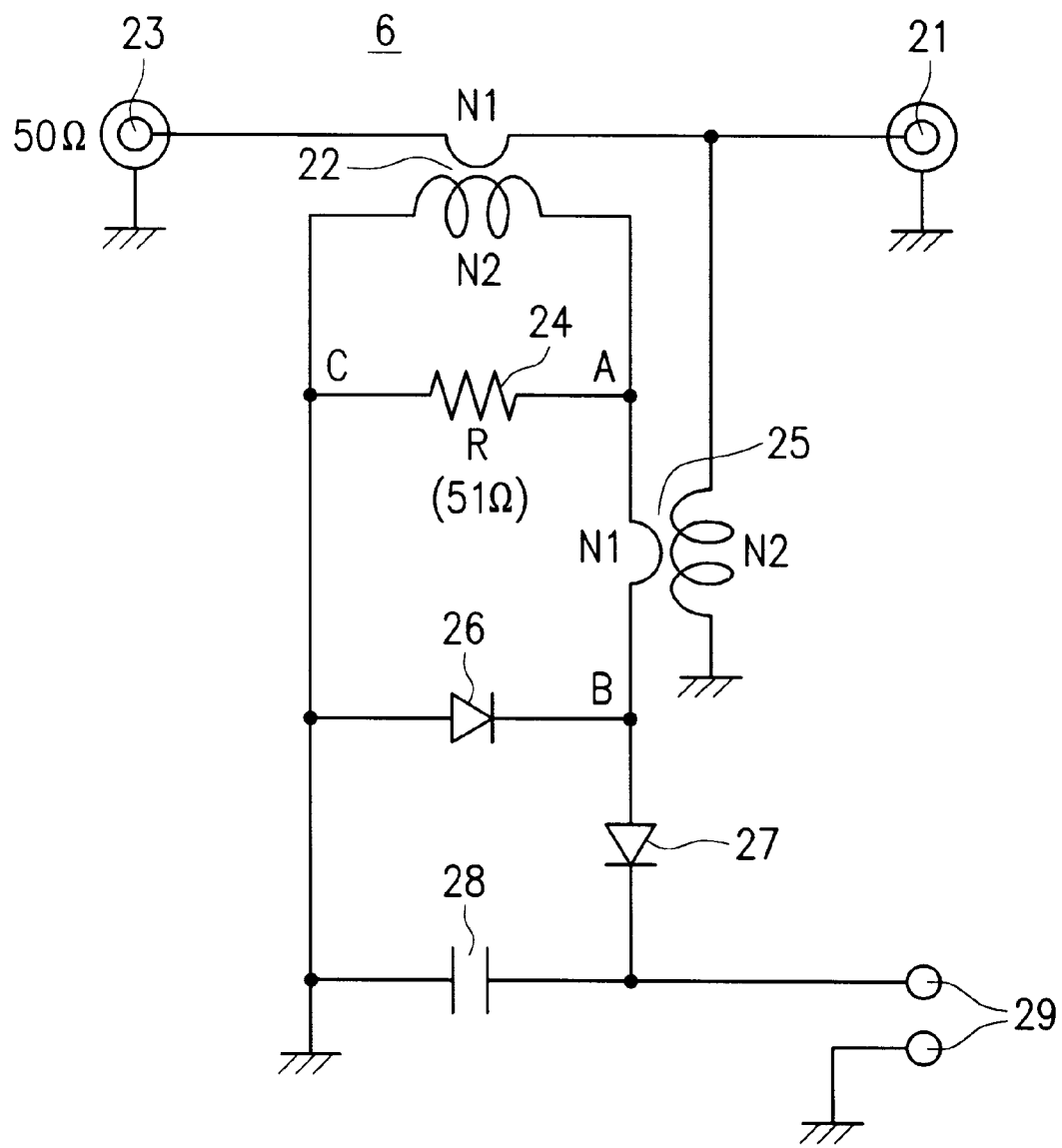
FIG. 15 illustrates an exemplary actual circuit for the detector unit used in this touch sensor.

FIG. 15 is an exemplary diagram of the actual circuits in detector unit 6 of the above mentioned embodiment of a touch sensor. The primary winding (winding $N_1$) of M coupling coil 22 is connected between terminal 21, to which oscillator unit 1 is connected, and terminal 23, to which electrode unit 5 is connected. Resistor 24, with resistance value R (R=51Ω), is connected to both ends of the secondary winding (winding $N_2$) of M coupling coil 22. One terminal (C) of resistor 24 is connected to ground. One end of the primary winding (winding $N_1$) of M coupling coil 25 is connected to the other terminal (A) of resistor 24. The other terminal (BL) of the primary winding of M coupling coil 25 is connected to the cathode of diode 26 and the anode of diode 27. The cathode of diode 27 is connected to one terminal of capacitor 28 and output terminal 29. The anode of diode 26 and the other terminal of capacitor 28 are connected to ground. Diodes 26 and 27 and capacitor 28 constitute a rectifier circuit (i.e., a circuit to detect the wave). The secondary winding of M coupling coil 25 is connected between terminal 21 and the ground.

In detector unit 6, which detects the reflected wave, the impedance as seen from the primary side of M coupling coil 22 is $R(N_1/N)^2$. If the resistance at terminal 23 is 50Ω, then the resistance at terminal 21 is $50+R(N_1/N)$. The power which can be obtained on the secondary side of M coupling coil 22 is $PR(N_1/N)^2/50+R(N_1/N)^2$. The voltage under AC is $\sqrt{PR^2}(N_1/N)^2/50+R(N_1/N)^2$. The voltage between A and B is $N_1/N_2\sqrt{50P+PR(N_1/N)^2}$. The reflected wave signal which is led through the secondary side of M coupling coil 22 is rectified by the circuit comprising diodes 26 and 27 and capacitor 28 and output via output terminal 29.

Figure 16:
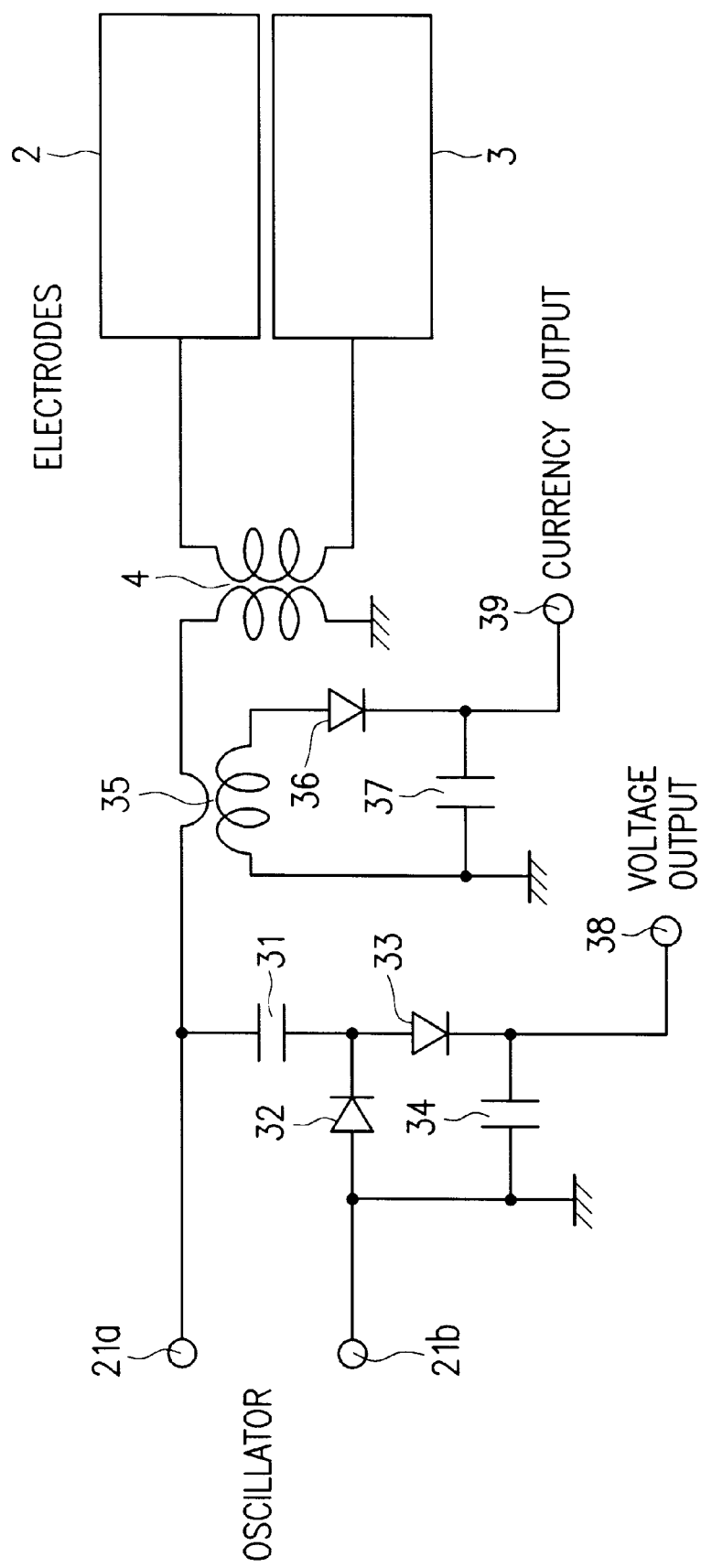
FIG. 16 illustrates another exemplary circuit for the detector unit used in this touch sensor.

Detector unit 6 may also detect the voltage and current of the power supplied to electrode unit 5. An example of this circuit is shown in FIG. 16. In FIG. 16, an oscillator unit is connected to terminals 21a and 21b. One end of capacitor 31 is connected to terminal 21 and the other to the cathode of diode 32 and the anode of diode 33. The anode of diode 32 is connected to ground. The cathode of diode 33 is connected to one end of capacitor 34 and to output terminal 38. The other end of capacitor 34 is connected to ground. The voltage output is obtained from output terminal 38.

One end of the primary winding of M coupling coil 35 is connected to terminal 21a. The other end of the primary winding is connected to transformer 4 of electrode unit 3. The anode of diode 36 is connected to one end of the secondary winding of M coupling coil 35, the other end is connected to ground. The cathode of diode 36 is connected to one end of capacitor 37 and to output terminal 39, while the other end of capacitor 37 is connected to ground. The current output is obtained at output terminal 39. Alternatively, the output of either voltage or current may be obtained singly.

Figure 17:
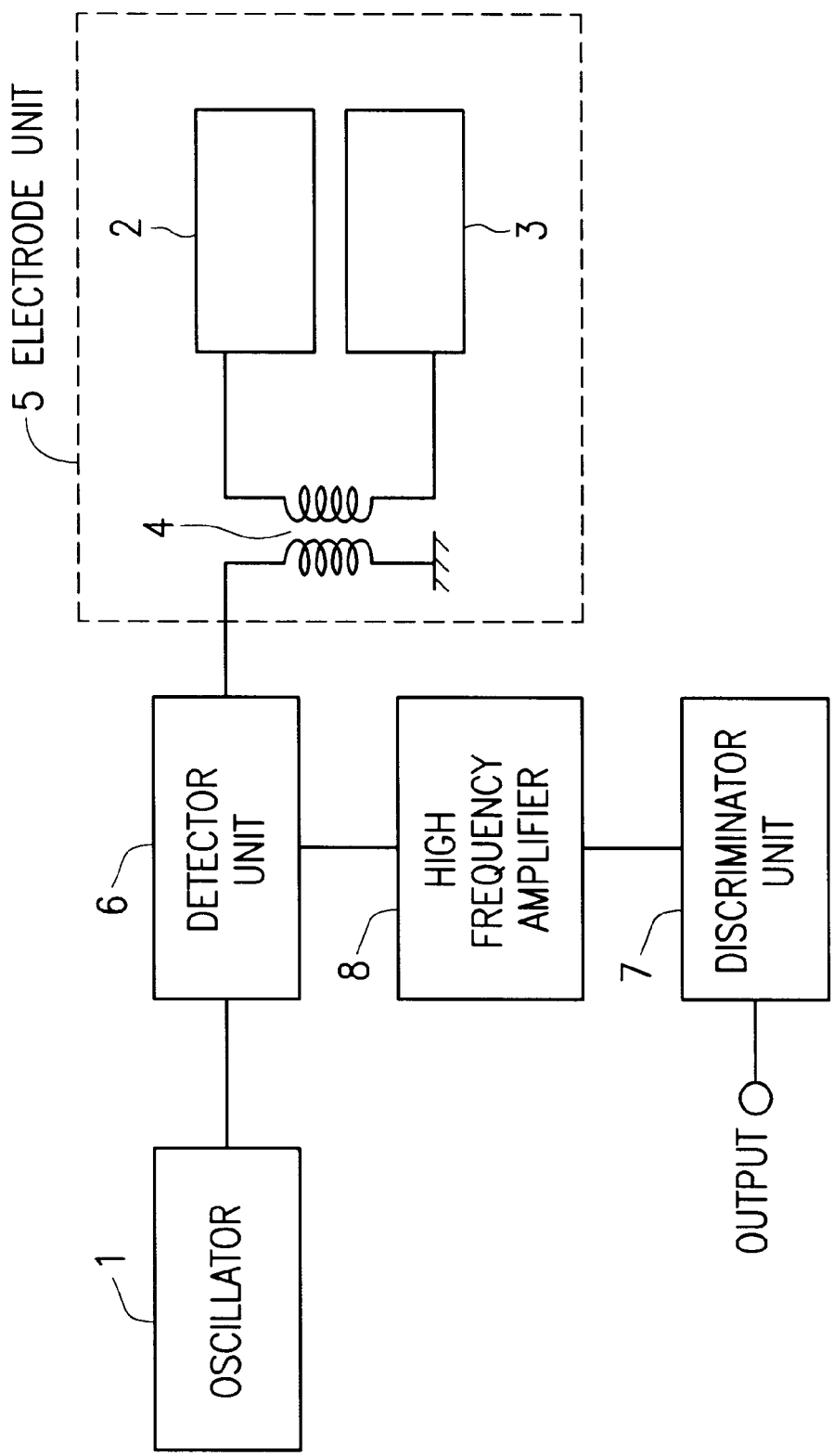
FIG. 17 illustrates another exemplary block diagram of this invention.
Figure 18:
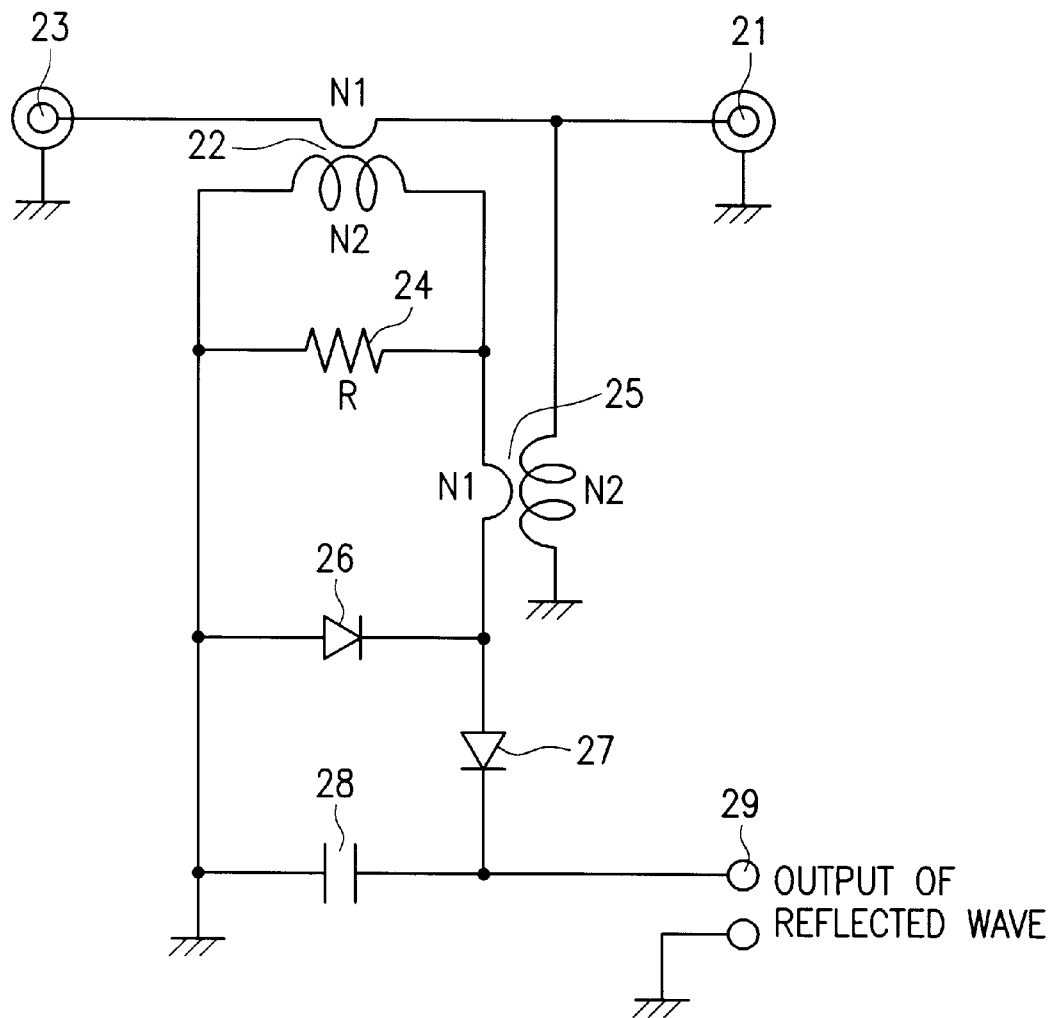
FIG. 18 illustrates a circuit for the detector unit used in the configuration shown in FIG. 1 of the prior art.
Figure 19:
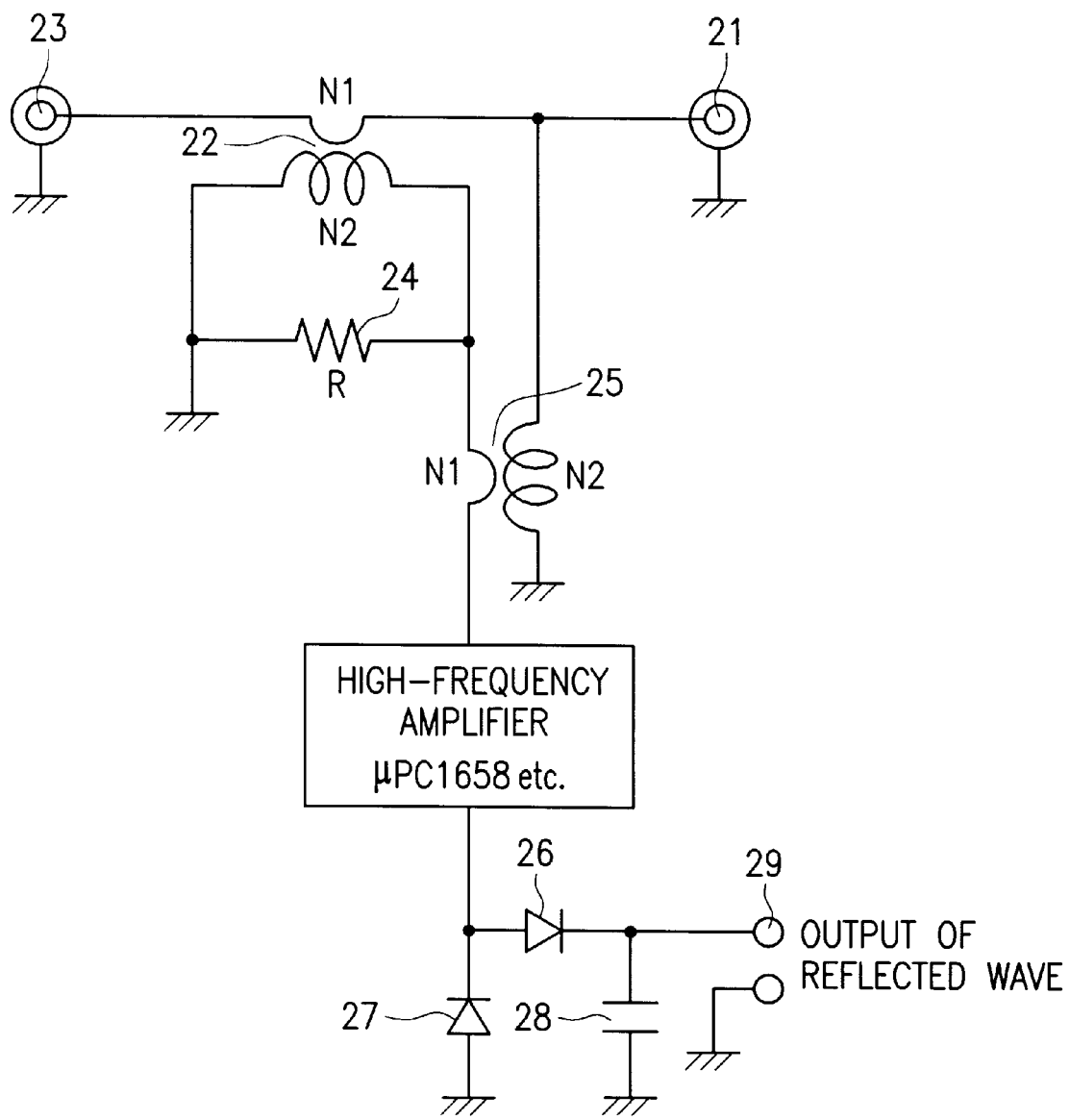
FIG. 19 illustrates a circuit of the detector unit and the high-frequency amplifier in the embodiment shown in FIG. 17.

Generally, detector unit 6 detects the wave, immediately converts it to DC and amplifies it with an operational amplifier or the like. To reduce costs, a low-priced operational amplifier with a single power supply may be used, setting the amplification factor higher. In this regard, the offset voltage of the operational amplifier would be amplified and the offset voltage of the output voltage would be higher. This would adversely affect the resolution of the control unit (i.e., the discriminator unit 6). To address this problem, a high-frequency amplifier 8 is provided directly behind detector 6, as shown in FIG. 17. Because the voltage is high after the wave is detected and converted to DC, an operational amplifier with a lower amplification factor can be used. It is also possible to dispense of the amplifier altogether. In this way the resolution of the sensor can be enhanced. FIG. 19 is the actual circuit used in FIG. 17. Amplifier 8 is placed at a location before the circuit where diodes 26 and 27 detect the wave, and there it amplifies the signal. Amplifier 8 may be an IC, or a circuit may be assembled for it using a transistor or FET.

Figure 20:
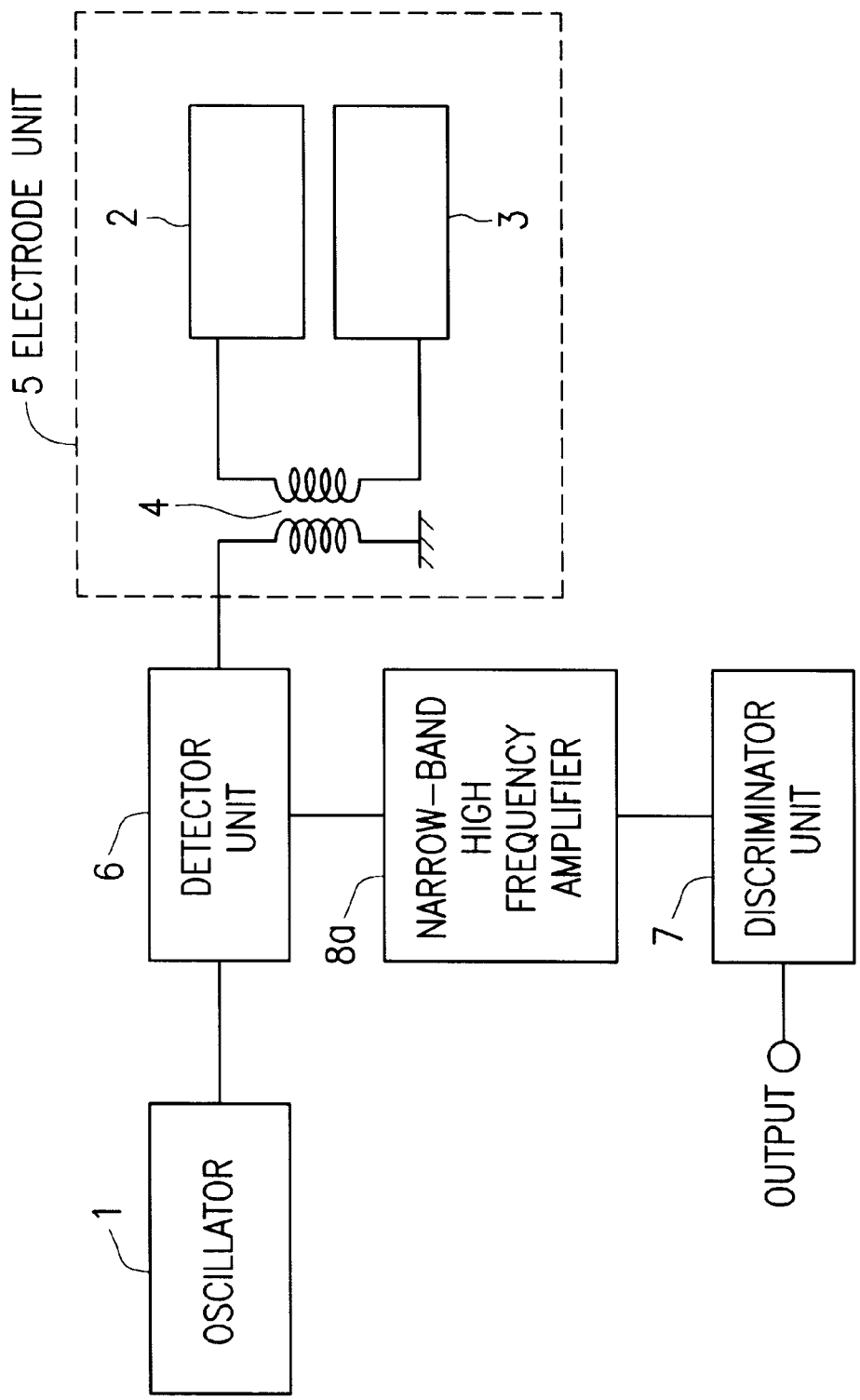
FIG. 20 illustrates a block diagram of another embodiment according to this invention.

Depending on the environment in which the sensor is used, external noise from electrode unit 5 may get into the circuit and cause the sensor to malfunction. If noise gets into the output voltage of detector unit 6, it will have a significant effect on the output of the sensor. To improve the immunity of the sensor to noise ratio, a filter is provided in high-frequency amplifier 8 to reduce other frequency components (FIG. 19). Since the output waveform of detector unit 6 is shaped by the filter, the high-frequency component is reduced and the accuracy of the sensor is improved. FIG. 20 shows the circuit for this. Narrow-band high-frequency amplifier 8a is also used as amplifier 8 in FIG. 19.

Figure 21:
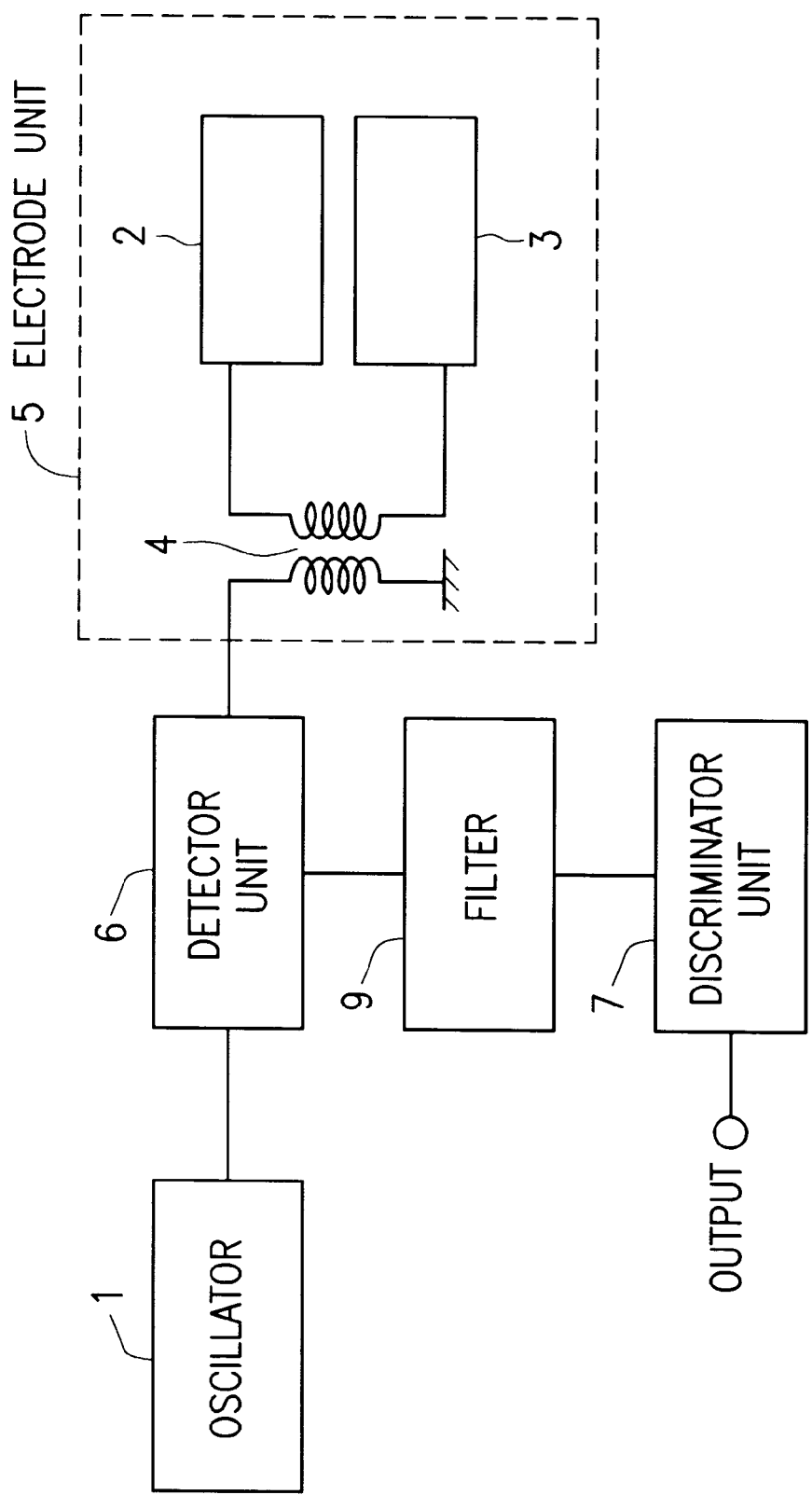
FIG. 21 illustrates a block diagram of yet another embodiment according to this invention.

As shown in FIG. 21, a filter 9 at the frequency of use is placed between detector unit 6 and discriminator unit 7. Thus, even if other frequency components should intrude from electrode unit 5, they will be eliminated by the filter. This will prevent the sensor from malfunctioning. Also, since a signal at the frequency of use is selectively received, the sensitivity of the sensor is improved.

Figure 22A:
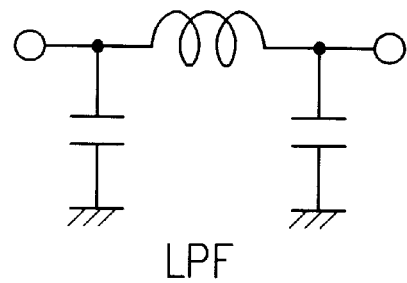
FIG. 22 illustrates the circuits of the filter shown in FIG. 21.
Figure 22B:
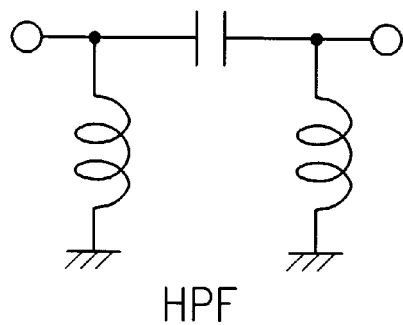
Figure 22C:
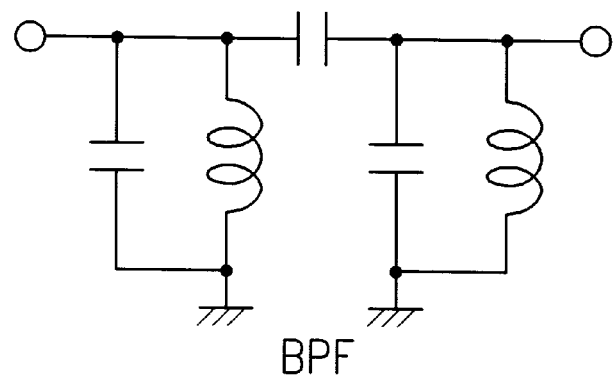

FIG. 22 shows several examples of a circuit for filter 9. FIG. 22(a) is a low-pass filter (LPF) circuit; FIG. 22(b) is a high-pass filter (HPF) circuit; and FIG. 22(c) is a band-pass filter (BPF) circuit.

Figure 23:
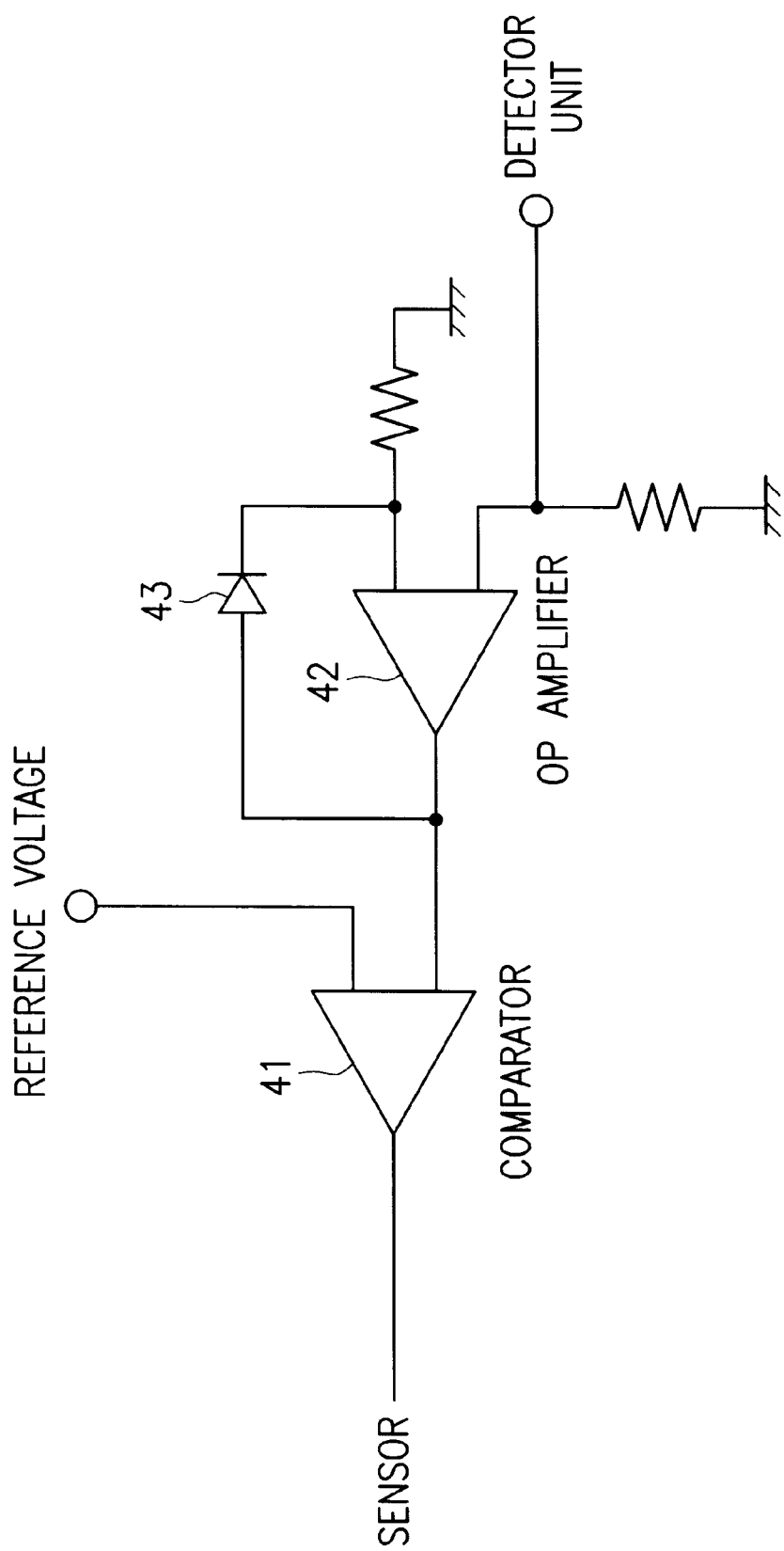
FIG. 23 illustrates a circuit of the detector unit in the above embodiments.

FIG. 23 shows an example of a circuit for discriminator unit 7. Comparator 41 compares the detected voltage with a reference voltage, but the signal from the detector unit 7 is amplified by operational amplifier 42 before it is fed to comparator 41. Operational amplifier 42 uses a diode 43 which is the same as that used to detect the wave in the detector unit 7. This arrangement is made because the detecting diode may exhibit variations in output voltage depending on the ambient temperature. To compensate for this, it is desirable that the rectification in the late-stage amplifier be achieved by an identical diode.

Figure 24:
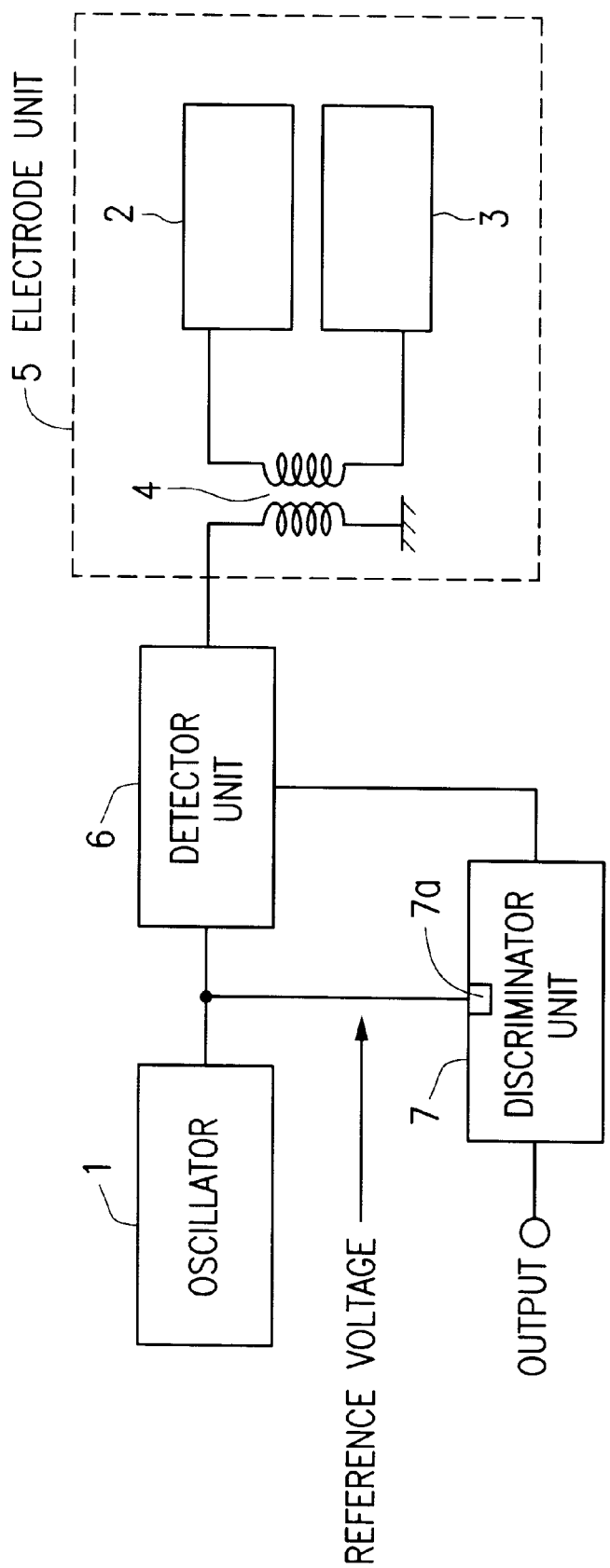
FIG. 24 illustrates a block diagram of yet another embodiment according to this invention.

FIG. 24 is an exemplary block diagram of another embodiment of a touch sensor. The output of oscillator unit 1 is input to discriminator unit 7. Circuit 7a in discriminator unit 7 detects the waveform of the output of oscillator unit 1 and uses it as a reference voltage for the discriminator unit 7. Even if the output of oscillator unit 1 changes so that the output of detector unit 6 varies, the reference voltage will vary correspondingly. Since the reference voltage responds to variations in the oscillator, the sensor will still be able to function normally unless the oscillator stops working or breaks completely.

Figure 25:
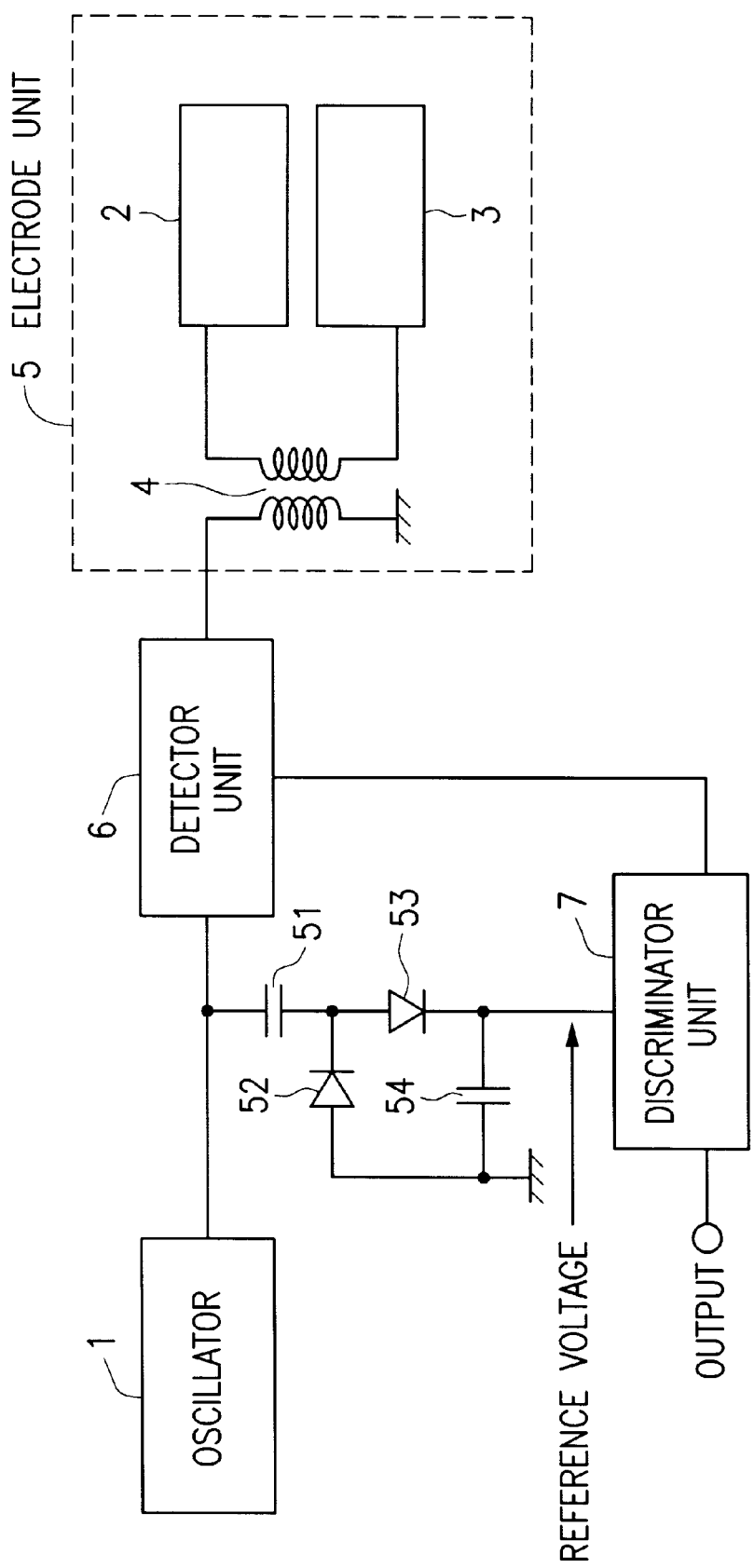
FIG. 25 illustrates a block diagram of yet another embodiment according to this invention.

FIG. 25 is an exemplary block diagram of another embodiment of a touch sensor. The output voltage of the diode in detector unit 6 which detects the wave varies with the ambient temperature. Here discriminator unit 7 uses the output of oscillator unit 1 as its reference voltage. Since this detector circuit uses the same diode as that used to detect the waveform in detector unit 6, it can perform in a stable fashion regardless of temperature variations.

Figure 26:
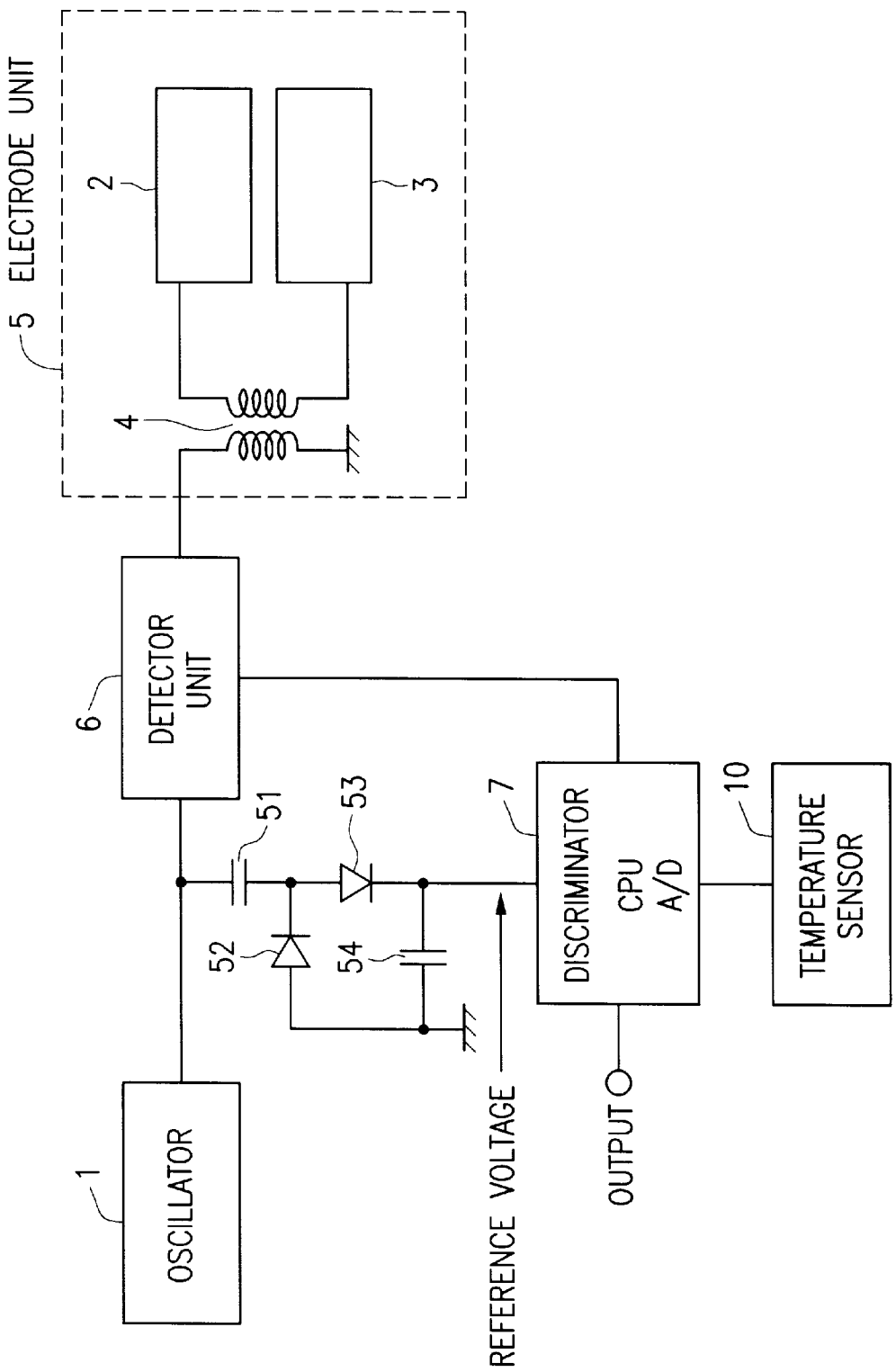
FIG. 26 illustrates a block diagram of yet another embodiment according to this invention.

FIG. 26 is an exemplary block diagram of another embodiment of a touch sensor. This embodiment has a temperature sensor 10 in discriminator unit 7. In response to an output signal from temperature sensor 10, the reference voltage used in discriminator unit 7 is varied to correct for the temperature characteristics of the detecting diode in detector unit 6. This makes the performance of detector unit 6 more stable.

Figure 27:
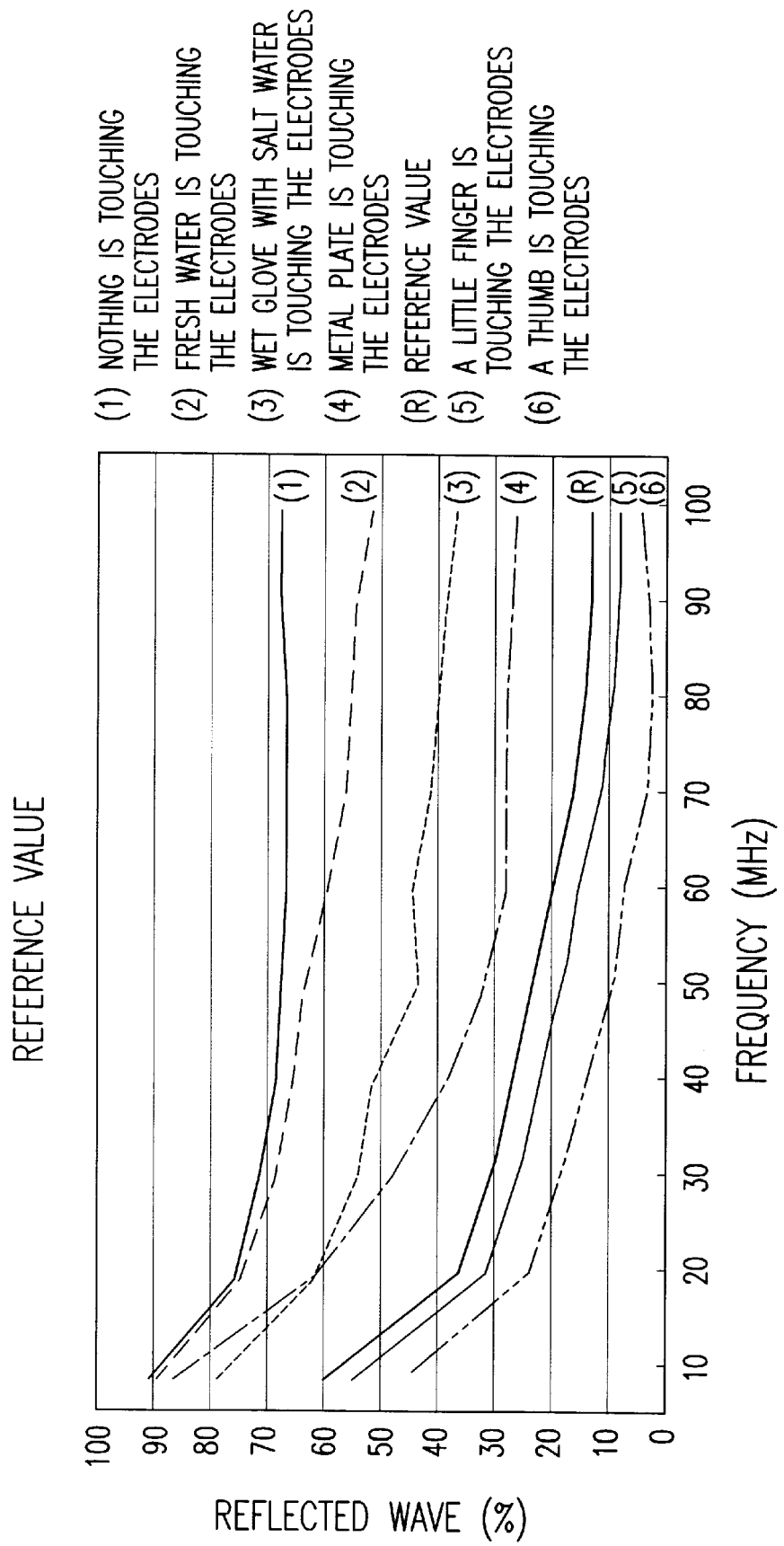
FIG. 27 illustrates a graph of the relationship between the frequency and the reflected wave amplitude for explaining the reference value.

In discriminator unit 7, the reflected wave varies according to the frequency as shown in FIG. 27. When the output value from the detector unit 6 increases because of outside noise, the voltage should be measured when the output value becomes lower than the value shown in FIG. 27.

Figure 28:
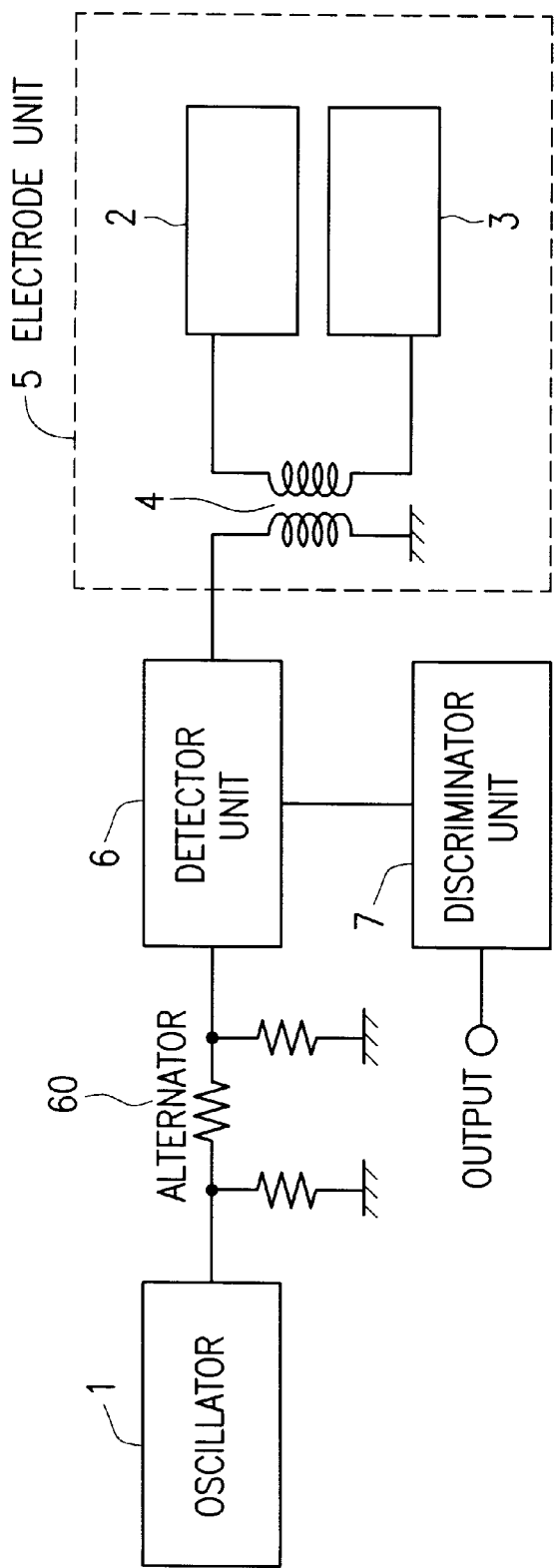
FIG. 28 illustrates a block diagram of yet another embodiment according to this invention.

FIG. 28 is an exemplary block diagram of yet another embodiment of a touch sensor. This embodiment has an attenuator 60 between oscillator unit 1 and detector unit 6. The output of oscillator unit 1 normally remains stable in the face of changes in load impedance due to the presence of a body part. When there is mismatching of the load impedance values, attenuator 60 mitigates the load-dependent variation of the output of oscillator unit 1 to ensure that the performance of the detector remains stable. Even with a substantial loss component, the attenuator 60 ensures that the oscillator unit 1 will perform in a stable fashion. However, since an excessive portion of the power going through will be lost if the loss fraction becomes too great, it is best to keep it a around 50%.

Figure 29:
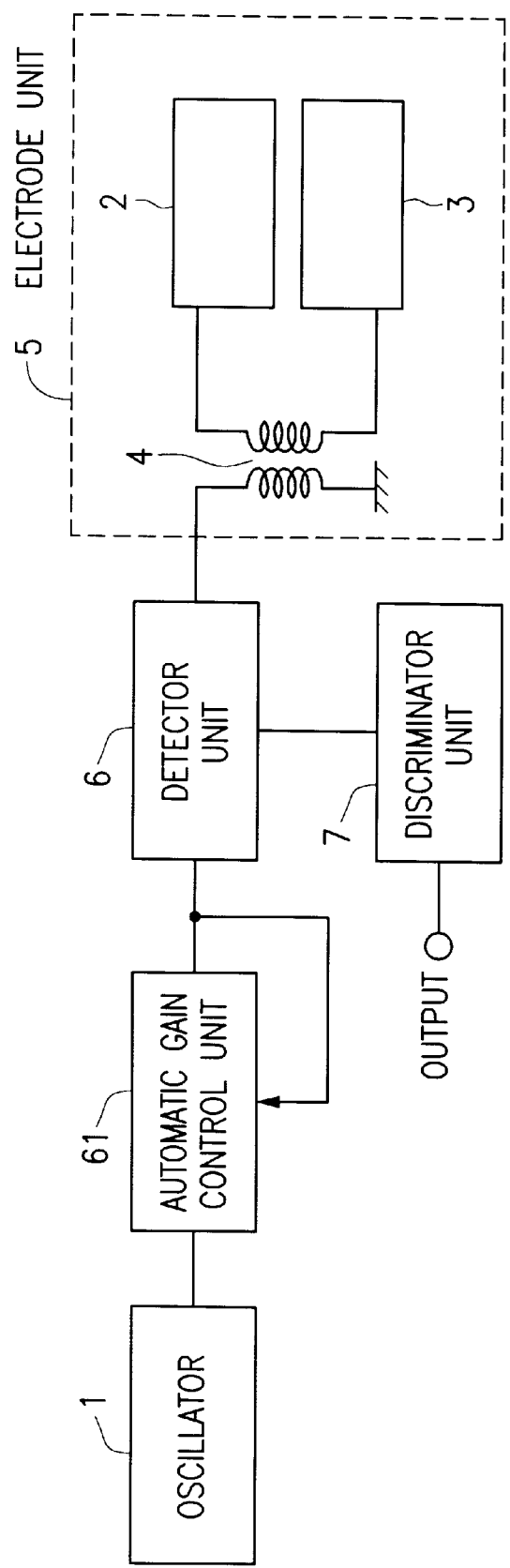
FIG. 29 illustrates a block diagram of yet another embodiment according to this invention.

FIG. 29 is an exemplary block diagram of still another embodiment of a touch sensor. This embodiment has an automatic gain control unit 61 between oscillator unit 1 and detector unit 6. Automatic gain control circuit 61 stabilizes the output of oscillator unit 1 and sends it to electrode unit 5. This improves the accuracy of detection.

Figure 30:
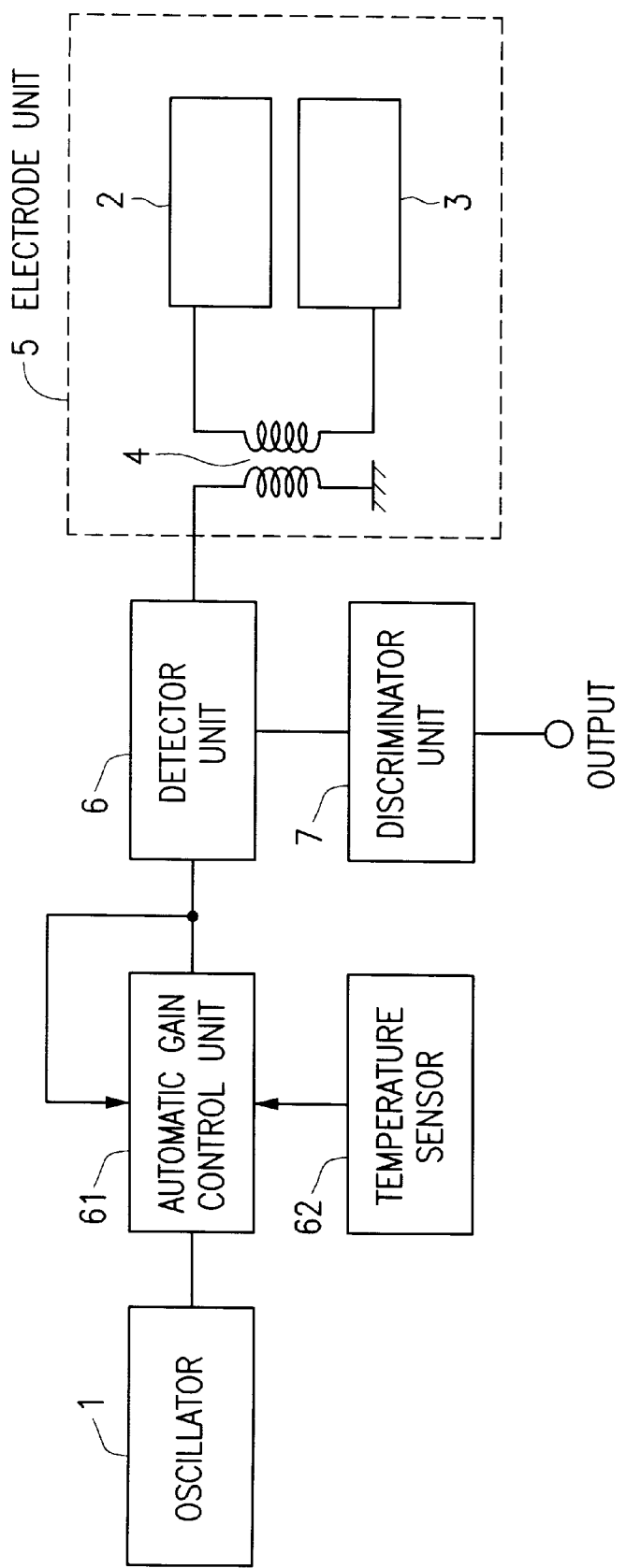
FIG. 30 illustrates a block diagram of yet another embodiment according to this invention.

FIG. 30 has a temperature sensor 62 in addition to the circuit shown in FIG. 29. To compensate for the temperature characteristics of the diode in detector unit 6, a temperature sensor 62 and an automatic gain control circuit 61 are provided. If the temperature drops, the output voltage of oscillator 1 is boosted. In this way the temperature of the diode can be compensated for.

Figure 31:
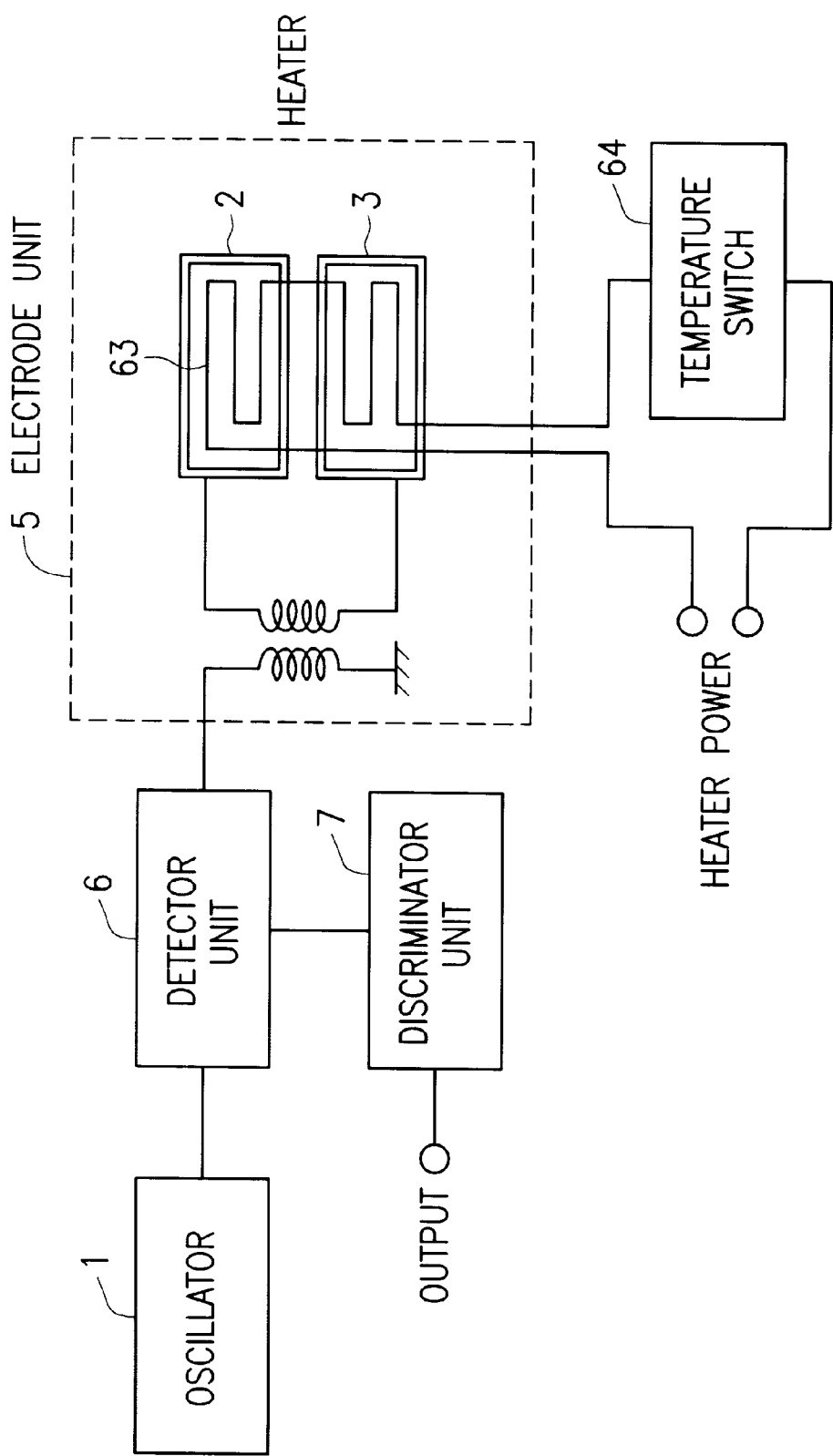
FIG. 31 illustrates a block diagram of yet another embodiment according to this invention.

FIG. 31 is an exemplary block diagram of still another embodiment of a touch sensor. This embodiment has a heater 63 in electrode unit 5. Electrodes 2 and 3 are formed on top of heater 63. The temperature of electrodes 2 and 3 is kept constant by temperature switch 64. Electrode unit 5 is the location where a person is to touch the sensor. At temperatures below zero, however, it is unsafe to do so. Heater 63 and temperature sensor 64 in electrode unit 5 allow the unit to be heated at low temperatures.

The impedance of a circuit changes when a human being touches an electrode, and a signal is detected which corresponds to this change in impedance. From this signal, a discriminator unit makes a determination whether someone has touched the electrode. The touch sensor will not respond if the object which touches the electrode is not an actual finger, so it can discriminate accurately when it is touched by something else. The sensor has stable temperature characteristics. The sensor needs no adjustment and provides a high degree of security. That is, it is extremely difficult to fabricate a human body part, in particular, a finger. The sensor is virtually immune to electromagnetic fields. Since the sensor requires little power, the adverse effects on human beings is extremely small.

What is claimed is:

1. A touch sensor for sensing a touch of a body part, comprising:

an oscillator which outputs a high-frequency signal;

an electrode unit comprising a pair of electrodes which applies said high-frequency signal from said oscillator unit to the body part;

a detector unit which detects a variety of impedance value varied by said body part contacting said pair of electrodes, and outputs an output signal based on said variety of impedance values; and a discriminator unit which determines whether said body part is in contact with said pair of electrodes by comparing said output signal from said detector unit with a predetermined reference value, wherein a capacitance between the body part and said pair of electrodes increases when the body part is in contact with said pair of electrodes, and a total resistance value of a high-frequency impedance real value of the part of the body part and a circuit resistance value including said pair of electrodes matches an output impedance at a predetermined frequency of said oscillator, allowing said discriminator unit to determine that the contact is that of the body part.

2. A touch sensor according to claim 1, wherein the capacitance between the body part and said pair of electrodes does not increase when the body part is not in close enough contact with said pair of electrodes, the capacitance then decreases, and an imaginary component of an impedance value increases and does not match to the output impedance at the predetermined frequency of said oscillator, not allowing said discriminator unit to determine that the contact is that of the body part.

3. A touch sensor according to claim 1, wherein said discriminator unit determines which body part is in contact with said pair of electrodes.

4. A touch sensor according to claim 1, wherein said pair of electrodes has symmetrical forms.

5. A touch sensor according to claim 1, wherein said pair of electrodes is arranged in parallel.

6. A touch sensor according to claim 1, wherein said pair of electrodes comprises a transformer supplying electricity to said pair of electrodes, and matching a first impedance at a first side of said transformer to a second impedance at a second side of said transformer when the body part makes contact with said pair of electrodes.

7. A touch sensor according to claim 1, wherein said pair of electrodes comprises an impedance converter circuit to supply electricity to said pair of electrodes, and to match an impedance when the body part makes contact with said pair of electrodes.

8. A touch sensor according to claim 1, wherein said pair of electrodes is a detached-type sensor which is separated from said other units.

9. A touch sensor according to claim 1, wherein said pair of electrodes is coated with a thin protective layer.

10. A touch sensor according to claim 1, wherein said impedance value between said pair of electrodes and the body part is set at more than 500 PF.

11. A touch sensor according to claim 1, wherein said pair of electrodes has a transmissivity which is set at more than 50%.

12. A touch sensor according to claim 1, wherein said pair of electrodes comprises a high-frequency conductor.

13. A touch sensor according to claim 1, wherein said pair of electrodes comprises a semiconductor having a high frequency loss.

14. A touch sensor according to claim 1, wherein said pair of electrodes is shaped like a rod.

15. A touch sensor according to claim 1, wherein said high-frequency signal of said oscillator is set between 0.1 and 300 MHz.

16. A touch sensor according to claim 1, wherein said oscillator generates a plurality of high-frequency signals.

17. A touch sensor according to claim 1, wherein said detector unit outputs a voltage value converted from a reflection wave power.

18. A touch sensor according to claim 1, wherein said detector unit detects a voltage of said pair of electrodes thereby detecting if the body part is in contact with said pair of electrodes.

19. A touch sensor according to claim 1, wherein said detector unit further comprises a high-frequency amplifier.

20. A touch sensor according to claim 1, wherein said detector unit further comprises a narrow-band high-frequency amplifier.

21. A touch sensor according to claim 1, wherein said detector unit further comprises a filter to selectively pass high-frequency signals having different frequencies.

22. A touch sensor according to claim 1, wherein said discriminator unit comprises a temperature compensating circuit which includes a diode which is identical to a diode used in said detector unit.

23. A touch sensor according to claim 1, wherein said discriminator unit uses an output signal from said oscillator as a reference signal for discrimination.

24. A touch sensor according to claim 1, wherein said reference signal from said oscillator is detected by a detecting element which is identical to an element used on said detector unit.

25. A touch sensor according to claim 1, wherein said discriminator unit determines that the body part is in contact with said pair of electrodes when said output signal from said detector units is lower than a reference signal.

26. A touch sensor according to claim 1, further comprising an attenuator between said oscillator and said detector unit.

27. A touch sensor according to claim 1, wherein said attenuator passes half of the input power sent from said oscillator.

28. A touch sensor according to claim 1, further comprising an automatic gain control unit between said oscillator and said detector unit.

29. A touch sensor according to claim 1, further comprising an automatic gain control unit and a temperature sensor between said oscillator and said detector unit, controlling the gain depending on an ambient temperature.

30. A touch sensor according to claim 1, further comprising a heater to heat said pair of electrodes and to keep said pair of electrodes at a constant temperature.

31. A touch sensor according to claim 1, wherein said detector unit outputs a voltage value converted from a standing wave ratio value.

32. A touch sensor according to claim 1, wherein said detector unit detects an electric currency output of said pair of electrodes thereby detecting if the body part is in contact with said pair of electrodes.

33. A touch sensor according to claim 1, wherein said predetermined reference value is within a predetermined range.

34. A touch sensor according to claim 25, wherein said reference signal is within a predetermined range.

35. A method of sensing a body part comprising:
   outputting a high-frequency signal;
   applying said high-frequency signal from an oscillator unit to the body part;
   detecting a variety of impedance values varied by said body part contacting a pair of electrodes, and which outputs and output signal based on said variety of impedance values; and
   determining whether said body part is in contact with said pair of electrodes by comparing said output signal with a predetermined reference value, wherein
      a capacitance between the body part and said pair of electrodes increases when the body part is in contact with said pair of electrodes, and a total resistance value of a high-frequency impedance real value of the part of the body part and a circuit resistance value including said pair of electrodes matches an output impedance at a predetermined frequency of said oscillator, allowing said discriminator unit to determine that the contact is that of the body part.

36. A touch sensor for sensing an object, comprising:
   a first unit applying a high frequency signal to the object and detecting multiple impedance values, and outputting a signal based on the multiple impedance values; and
   a second unit determining whether the object is in contact with electrodes by comparing the signal with a predetermined reference value, wherein
      a capacitance between the body part and said pair of electrodes increases when the body part is in contact with said electrodes, and a total resistance value of a high-frequency impedance real value of the part of the body part and a circuit resistance value including said electrodes match an output impedance at a predetermined frequency of said oscillator, allowing said discriminator unit to determine that the contact is that of the body part.

37. A method of sensing an object, comprising:

applying a high frequency signal to the object and detecting multiple impedance values, and outputting a signal based on the multiple impedance values; and determining whether the object is in contact with electrodes by comparing the signal with a predetermined reference value, wherein a capacitance between the body part and said pair of electrodes increases when the body part is in contact with said pair of electrodes, and a total resistance value of a high-frequency impedance real value of the part of the body part and a circuit resistance value including said electrodes match an output impedance at a predetermined frequency of said oscillator, allowing said discriminator unit to determine that the contact is that of the body part.

* * * * *